United States Patent
Herzog et al.

(10) Patent No.: US 12,431,650 B2
(45) Date of Patent: Sep. 30, 2025

(54) DECOUPLED SPRING AND ELECTRICAL PATH IN CONNECTOR INTERFACE

(71) Applicant: Apple Inc., Cupertino, CA (US)

(72) Inventors: Adam H. Herzog, Los Altos, CA (US); Mahmoud R. Amini, Sunnyvale, CA (US); Mohammed Nasser Khamis Al Jashmi, Sunnyvale, CA (US); George Tziviskos, San Jose, CA (US); Nikhil S. Pansare, Cupertino, CA (US); William P. Cornelius, Los Gatos, CA (US); Seungyong Baek, San Jose, CA (US)

(73) Assignee: Apple Inc., Cupertino, CA (US)

(*) Notice: Subject to any disclaimer, the term of this patent is extended or adjusted under 35 U.S.C. 154(b) by 407 days.

(21) Appl. No.: 17/951,888

(22) Filed: Sep. 23, 2022

(65) Prior Publication Data
US 2023/0020954 A1    Jan. 19, 2023

Related U.S. Application Data

(63) Continuation-in-part of application No. 17/180,841, filed on Feb. 21, 2021, now Pat. No. 11,677,174, which is a continuation of application No. 16/581,101, filed on Sep. 24, 2019, now Pat. No. 10,931,048.

(60) Provisional application No. 62/735,391, filed on Sep. 24, 2018.

(51) Int. Cl.
*H01R 13/11* (2006.01)
*H01R 12/59* (2011.01)
*H01R 13/62* (2006.01)
*H01R 13/6581* (2011.01)

(52) U.S. Cl.
CPC ......... *H01R 13/113* (2013.01); *H01R 12/592* (2013.01); *H01R 13/6205* (2013.01); *H01R 13/6581* (2013.01)

(58) Field of Classification Search
None
See application file for complete search history.

(56) References Cited

U.S. PATENT DOCUMENTS

| | | | |
|---|---|---|---|
| 4,477,134 A | 10/1984 | Wright | |
| 5,057,037 A | 10/1991 | Mouissie | |
| 5,911,584 A | 6/1999 | Larsen et al. | |
| 5,975,934 A | 11/1999 | Ichimura | |
| 6,077,124 A | 6/2000 | Etters et al. | |
| 7,544,066 B1 | 6/2009 | Lynch et al. | |
| 9,825,410 B2 | 11/2017 | Scritzky et al. | |
| 10,468,825 B2 * | 11/2019 | Zhao | H01R 13/504 |

(Continued)

OTHER PUBLICATIONS

U.S. Appl. No. 16/581,101, Non-Final Office Action mailed on Jun. 12, 2020, 8 pages.

(Continued)

*Primary Examiner* — Oscar C Jimenez
(74) *Attorney, Agent, or Firm* — Kilpatrick Townsend & Stockton LLP

(57) ABSTRACT

Connectors that support high-speed data transfers and have a high signal quality, good reliability, and are readily manufactured. One example can provide a connector receptacle that supports high-speed data transfers and has a high signal quality by employing contacts that are directly attached to a flexible circuit board.

19 Claims, 21 Drawing Sheets

(56) References Cited

U.S. PATENT DOCUMENTS

| | | |
|---|---|---|
| 10,931,048 B2 | 2/2021 | Amini et al. |
| 11,677,174 B2 | 6/2023 | Amini et al. |
| 2006/0234542 A1 | 10/2006 | Ko |
| 2008/0214043 A1 | 9/2008 | Ko |
| 2010/0151744 A1 | 6/2010 | Takahashi et al. |
| 2015/0162684 A1 | 6/2015 | Amini et al. |
| 2015/0222037 A1* | 8/2015 | Bulmer ............... H01R 13/113 439/660 |
| 2015/0263465 A1* | 9/2015 | Zhang ............... H01R 13/6581 29/882 |
| 2017/0229801 A1 | 8/2017 | Underwood et al. |
| 2017/0256881 A1* | 9/2017 | Lambie ............. H01R 13/6581 |
| 2017/0271806 A1 | 9/2017 | Kato et al. |
| 2017/0310048 A1 | 10/2017 | Kato et al. |
| 2018/0131111 A1* | 5/2018 | Tziviskos ............. H01R 12/79 |
| 2019/0103700 A1 | 4/2019 | Esmaeili et al. |
| 2019/0190214 A1 | 6/2019 | Choi |
| 2020/0067218 A1* | 2/2020 | Kim ................... H04M 1/0274 |
| 2021/0249806 A1 | 8/2021 | Amini et al. |
| 2021/0265751 A1 | 8/2021 | Lou et al. |
| 2021/0399500 A1* | 12/2021 | Chang ................... H01R 24/60 |
| 2022/0085560 A1 | 3/2022 | Soohoo et al. |

OTHER PUBLICATIONS

U.S. Appl. No. 16/581,101, Notice of Allowance mailed on Oct. 23, 2020, 8 pages.

U.S. Appl. No. 17/180,841, Final Office Action mailed on Oct. 20, 2022, 8 pages.

U.S. Appl. No. 17/180,841, Non-Final Office Action mailed on May 19, 2022, 10 pages.

British patent application No. 2314019.7 , "Combined Search and Examination Report", Feb. 28, 2024, 5 pages.

\* cited by examiner

DECOUPLED SPRING AND ELECTRICAL PATH IN CONNECTOR INTERFACE

CROSS REFERENCE TO RELATED APPLICATIONS

This application is a continuation-in-part of U.S. patent application Ser. No. 17/180,841, filed Feb. 21, 2021, which is a continuation of U.S. patent application Ser. No. 16/581,101 filed Sep. 24, 2019, which claims the benefit of U.S. provisional application No. 62/735,391, filed Sep. 24, 2018; which are incorporated by reference.

BACKGROUND

Power and data can be provided from one electronic device to another over cables that can include one or more wires, fiber optic cables, or other conductors. Connector inserts can be located at each end of these cables and can be inserted into connector receptacles in the communicating electronic devices.

Large amounts of data can be transferred among these connected electronic devices. But data transfers can be costly in terms of time and computing power. In order to reduce these data transfer times, it can be desirable that these connectors be capable of supporting high data rates. That is, it can be desirable that these connectors provide a high signal quality or signal integrity to allow high speed data transfers among connected electronic devices.

These connector inserts can be inserted into connector receptacles many times over the lifetime of an electronic device. Some devices can be connected to chargers, home or car audio equipment, or other types of electronic devices several times a day. Accordingly, it can be desirable that these connector inserts and connector receptacles be reliable and be able to withstand a high number of insertions and extractions.

Also, some of these electronic devices become tremendously popular. As a result, connector receptacles on the electronic devices and connector inserts on cables can be sold in very large quantities. Therefore, it can be desirable that these connectors be readily manufactured such that customer demand for them can be met.

Thus, what is needed are connectors that support high-speed data transfers and have a high signal quality, good reliability, and are readily manufactured.

SUMMARY

Accordingly, embodiments of the present invention can provide connectors that support high-speed data transfers and have a high signal quality, good reliability, and are readily manufactured.

An illustrative embodiment of the present invention can provide a connector receptacle that supports high-speed data transfers and has a high signal quality by employing connector contacts that include multiple structures. These multiple-structure contacts can use different structures for the various functions that can be performed by connector contacts. For example, spring contact forces can be provided by spring fingers, where the spring fingers do not actually convey signals or power but are utilized to provide a good mechanical and electrical connection between contacts in mated connectors. Since signals are not routed through the spring fingers, they can be formed of materials that are selected to provide a good spring force without regards to their conductivity. Since the remaining structures do not need to provide a spring force, contacts on a flexible printed circuit board (or flexible circuit board) can serve as electrical contacts to convey signals for the connector. In this way, signals at contacts of the connector can be routed through traces in the flexible circuit board. Traces on the flexible circuit board can be shielded, they can be part of a strip-line, or they can be (or can be part of) another routing structure used to improve signal quality and signal integrity. These routing techniques can reduce cross-talk, reduce electromagnetic interference, and enable a high data rate. Also, since the traces in the flexible circuit board can begin at contacting portions of the flexible circuit boards, stubs which can be located at an end of a traditional beam contact, can be reduced or eliminated for further improved high-frequency performance.

Differential signals conveyed by traces in these flexible circuit boards can be well-shielded. For example, a high-speed differential signal can be conveyed on two contacts formed on, or attached to, traces on an outside surface of the flexible circuit board. The two traces can connect to two vias of the flexible circuit board. The differential signal can then be conveyed by the vias to two traces on a middle layer of the board. Each pair of traces can be laterally shielded by ground or power supplies, as well as a ground plane on the bottom layer and a ground plane on the top layer. Positioning the vias such that there is short distance between the contacts and the vias can also help to shield the differential signals by allowing the ground planes to be positioned close to the contacts.

In these and other embodiments of the present invention, spring fingers can be located against a housing or shield of a connector insert. A flexible circuit board can have a portion that can be located on a surface of the spring fingers away from the housing or shield. The flexible circuit board can be glued or otherwise fixed to the spring fingers using pressure-sensitive adhesive, heat activated adhesive, temperature-sensitive adhesive, or other adhesive, laser or spot welding, or other appropriate material or process. Contacts can be formed on surfaces of contacting portions of the flexible circuit board away from the spring fingers. The contacts formed on the surface the contacting portions of the flexible circuit board can directly and electrically connect to contacts of a corresponding connector. The contacts can be plated, formed by vapor deposition, soldered, or formed in other ways on the contacting portions of the flexible circuit board In these and other embodiments of the present invention, each spring finger can provide support for one contacting portion of a flexible circuit board. This arrangement can work well to ensure that each contact on a contacting portion of a flexible circuit board has a force to push it against a corresponding contact when the contact on the contacting portion of the flexible circuit board is mated with the corresponding contact of a corresponding connector.

In these and other embodiments of the present invention, each spring finger can provide support for two contacting portions of a flexible circuit board. Having two contacting portions supported by each spring finger can help to ensure that each contact on a contacting portion of a flexible circuit board has a force to push it against a corresponding contact when the contact on the contacting portion of the flexible circuit board is mated with the corresponding contact of a corresponding connector.

In these and other embodiments of the present invention, each spring finger can provide support for more than two contacting portions of a flexible circuit board. For example, each spring finger can provide support for each of the contacting portions of a flexible circuit board. Having a limited number of spring fingers can help to simplify the assembly and manufacturing of components for a connector.

In these and other embodiments of the present invention, the spring fingers and contacting portions can be arranged in various ways. Again, each spring finger can support one, two, three, or more contacting portions. Each contacting portion can support one or more contacts. For example, a spring finger may support a contacting portion having one contact. A spring finger may support a contacting portion having two contacts. A single spring finger can support a single contacting portion having all the contacts of a row. Other configurations are also possible.

In these and other embodiments of the present invention, the spring fingers can be conductive. These spring fingers can be formed of steel, stainless steel, spring steel, copper, bronze, ceramic, or other material. The spring fingers can be held in place by being partially encased in, or attached to, a housing for the connector. The housing can be formed of plastic, a ferritic or other magnetic material (to form a magnetic element), or other conductive or nonconductive material. The spring fingers can be held in place by being attached to, or formed as part of, a shield around the connector. The spring fingers can also be held in place by a housing that is shielded by the shield. The spring fingers can be formed by stamping, metal-injection molding, forging, deep drawing, or other process.

In these and other embodiments of the present invention, the spring fingers can be nonconductive. These spring fingers can be formed of plastic, LDS plastic, ceramic, or other material. The spring fingers can be held in place by being partially encased in, or formed with, a housing for the connector. The housing can be formed of plastic, a ferritic or other magnetic material (to form a magnetic element), or other conductive or nonconductive material. The spring fingers can be formed by molding, injection molding, or other process. The spring fingers can be formed as part of the housing for the connector.

The contacts in these and other embodiments of the present invention can be formed in various ways. Where the contacts are sufficiently substantial, the spring fingers can be omitted. Instead, contacts can be supported by a tongue or other structure of a connector. The contacts can be attached directly to a flexible circuit board in order to support high-speed data transfers and to provide a high signal quality.

In one example, a tongue of a connector insert or connector receptacle can include a flexible circuit board having pads on a top and bottom sides. Surface-mount contacting portions of contacts can be soldered to the pads on the flexible circuit board. The contacts on the top side of the flexible circuit board can be held together by a top housing portion and contacts on the bottom side of the flexible circuit board can be held together by a bottom housing portion. Depending on a thickness of the contacts, the top housing portion and the bottom housing portion can perform some or all of the functions of spring fingers. A reinforcement frame can be positioned around a front and sides of the tongue for electromagnetic interference shielding, grounding, and mechanical support. A ground pad for a top of a tongue and a ground pad for a bottom of the tongue can be added. The top housing portion and bottom housing portion can be supported by a tongue molded around the flexible circuit board, the top housing portion, and the bottom housing portion.

In another example, top contacts can be held together by a top housing portion and bottom contacts can be held together by a bottom housing portion. Depending on a thickness of the contacts, the top housing portion and the bottom housing portion can perform some or all of the functions of spring fingers. An insulating layer can be positioned between the top housing portion and the bottom housing portion. The insulating layer can be adhesive to help with assembly. A reinforcement frame can be positioned along sides of the top housing portion, and the bottom housing portion for electromagnetic interference shielding, grounding, and mechanical support. A ground pad for a top of a tongue and a ground pad for a bottom of the tongue can be added. A tongue can be molded around this structure. A flexible circuit board can be inserted into the opening in the back of the molded tongue portion. Surface-mount contacting portions of the top contacts and bottom contacts can be reflow soldered to pads on the flexible circuit board.

In these and other embodiments of the present invention, traces in the flexible circuit boards can electrically connect to conductors in a cable, traces in other flexible circuit boards, one or more printed circuit boards, or other appropriate routing paths. This can save space in a connector as compared to conventional beam contacts. This saved space can be used for various purposes. For example, one or more electrical components can be placed on the flexible circuit boards. One or more magnets can be placed in the connectors to provide an increase in retention force of a connector insert in a connector receptacle.

In these and other embodiments of the present invention, one or more magnets can be located in a connector insert. The magnets can magnetically attract a magnetic element on a tongue of a corresponding connector receptacle when the connector insert is mated with the corresponding connector receptacle. The magnetic element on the tongue can be formed of a ferritic or other magnetic material. For example, a tongue can include a metal-injection molded frame, where the injected metal forms a magnetic element. Magnets in the connector receptacle can attract a magnetic element near a front of the connector insert when the connector insert is mated with the corresponding connector receptacle, where the magnetic element is formed of ferritic or other magnetic material. In these and other embodiments, the magnets can be positioned, either spatially or by orientation, such that they allow the connector insert to be inserted into the connector receptacle in either of two rotational orientations separated by 180 degrees.

These multi-structure contacts can be used in various ways in connectors consistent with embodiments of the present invention. For example, these multi-structure contacts can be used as contacts in a connector insert where the multi-structure contacts directly and electrically connect to contacts on a tongue in a corresponding connector receptacle when the connector insert and the corresponding connector receptacle are mated. These multi-structure contacts can be used as contacts in a connector receptacle where the multi-structure contacts directly and electrically connect to contacts on a tongue of a corresponding connector insert when the corresponding connector insert and the connector receptacle are mated. These multi-structure contacts can also be used as contacts on a tongue of a connector insert where the multi-structure contacts directly and electrically connect to contacts in a corresponding connector receptacle when the connector insert and the corresponding connector receptacle are mated. These multi-structure contacts can be used as contacts on a tongue of a connector receptacle where the multi-structure contacts directly and electrically connect to contacts of a corresponding connector insert when the corresponding connector insert and the connector receptacle are mated.

While embodiments of the present invention can be useful as USB Type-C connector inserts and connector receptacles, these and other embodiments of the present invention can be used as connector receptacles in other types of connector systems, such as a Peripheral Component Interconnect express (PCIe) connector system.

In various embodiments of the present invention, spring fingers, contacts, shields, ground pads, backplates, reinforcement frames, and other conductive portions of a connector receptacle or connector insert can be formed by stamping, metal-injection molding, machining, micro-machining, 3-D printing, or other manufacturing process. The conductive portions can be formed of stainless steel, steel, copper, copper titanium, phosphor bronze, or other material or combination of materials. They can be plated or coated with nickel, gold, or other material.

The nonconductive portions, such as spring fingers, housings, housing portions, tongue moldings, insulating layers, and other structures can be formed using injection or other molding, 3-D printing, machining, or other manufacturing process. The nonconductive portions can be formed of silicon or silicone, rubber, hard rubber, plastic, nylon, liquid-crystal polymers (LCPs), ceramics, or other nonconductive material or combination of materials. The printed circuit boards or other boards used can be formed of FR-4 or other material.

Embodiments of the present invention can provide connector receptacles and connector inserts that can be located in, and can connect to, various types of devices such as portable computing devices, tablet computers, desktop computers, laptops, all-in-one computers, wearable computing devices, smart phones, storage devices, portable media players, navigation systems, monitors, power supplies, video delivery systems, adapters, remote control devices, chargers, and other devices. These connector receptacles and connector inserts can provide interconnect pathways for signals that are compliant with various standards such as one of the Universal Serial Bus (USB) standards including USB Type-C, High-Definition Multimedia Interface® (HDMI), Digital Visual Interface (DVI), Ethernet, DisplayPort, Thunderbolt™, Lightning™ Joint Test Action Group (JTAG), test-access-port (TAP), Peripheral Component Interconnect express, Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. Other embodiments of the present invention can provide connector receptacles and connector inserts that can be used to provide a reduced set of functions for one or more of these standards. In various embodiments of the present invention, these interconnect paths provided by these connector receptacles and connector inserts can be used to convey power, ground, signals, test points, and other voltage, current, data, or other information.

Various embodiments of the present invention can incorporate one or more of these and the other features described herein. A better understanding of the nature and advantages of the present invention can be gained by reference to the following detailed description and the accompanying drawings.

DESCRIPTION OF ILLUSTRATIVE EMBODIMENTS

Figure 1:
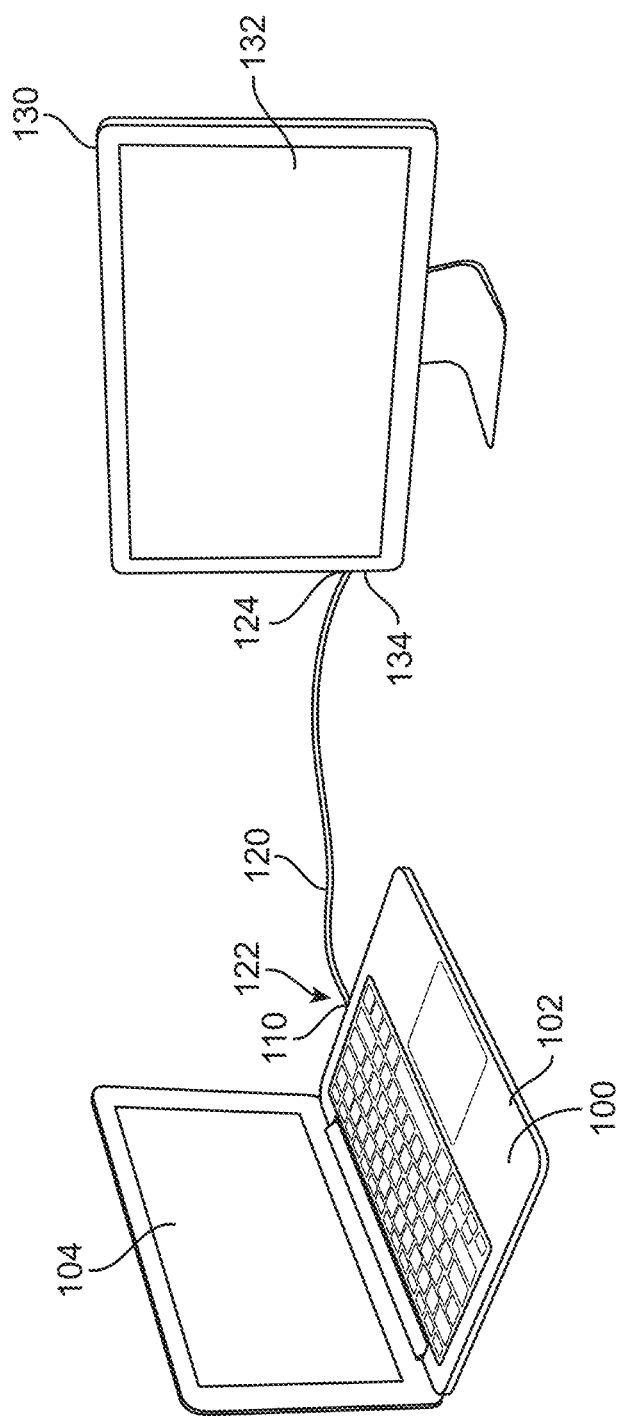
FIG. 1 illustrates an electronic system that can be improved by the incorporation of embodiments of the present invention.

FIG. 1 illustrates an electronic system that can be improved by the incorporation of an embodiment of the present invention. This figure, as with the other included figures, is shown for illustrative purposes and does not limit either the possible embodiments of the present invention or the claims.

In this example, monitor 130 can be in communication with computer 100. Computer 100 can be substantially housed in device enclosure 102. Computer 100 can provide video or other data over cable 120 to monitor 130. Video data can be displayed on the video screen 132 of monitor 130. Computer 100 can similarly include a screen 104. In these and other embodiments the present invention, other types of devices can be included, and other types of data can be shared or transferred among the devices. For example, computer 100 and monitor 130 can be portable computing devices, tablet computers, desktop computers, laptops, all-in-one computers, wearable computing devices, smart phones, storage devices, portable media players, navigation systems, monitors, power supplies, video delivery systems, adapters, remote control devices, chargers, and other devices.

Cable 120 can be one of a number of various types of cables. For example, it can be a Universal Serial Bus (USB) cable such as a USB Type-C cable, Thunderbolt, DisplayPort, Lightning, or other type of cable. Cable 120 can include compatible connector insert 110 and compatible connector insert 124 that plug into connector receptacle 122 on computer 100 and connector receptacle 134 on monitor 130. Examples of connector inserts 110 and connector receptacles (which can be the same or different as connector inserts 124, connector inserts 900, and connector receptacle 134) are shown in the following figures.

Figure 2:
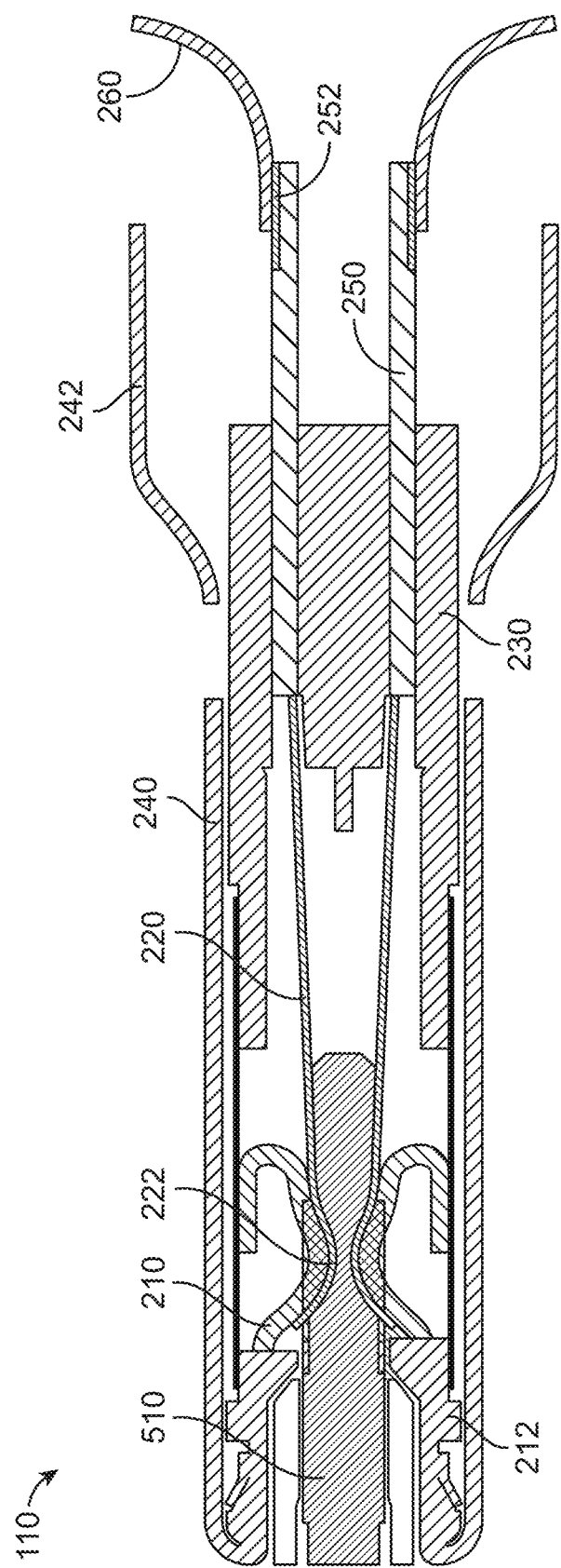
FIG. 2 illustrates a cutaway side view of a connector insert according to an embodiment of the present invention.
Figure 10:
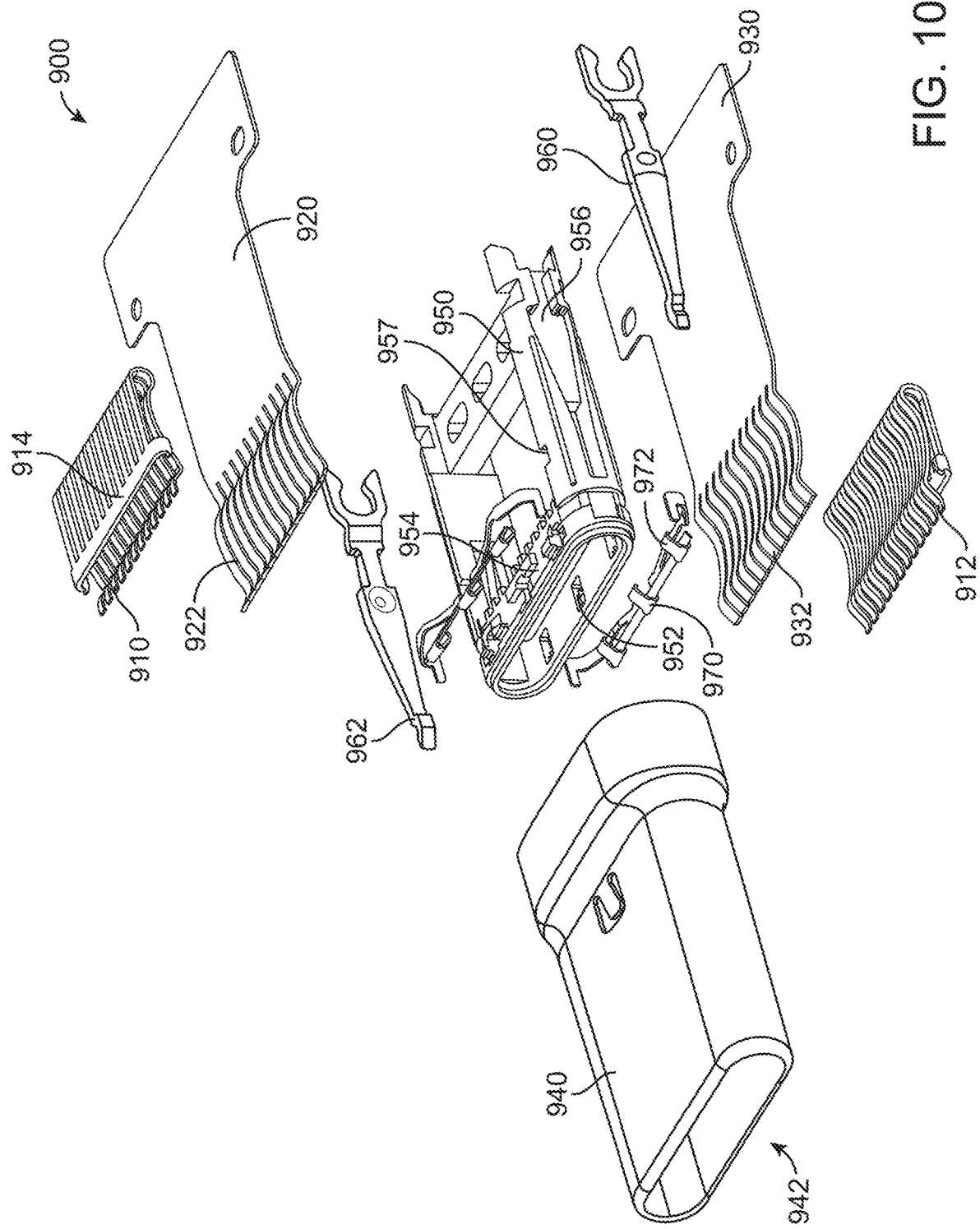
FIG. 10 is an exploded view of the connector insert of FIG. 9.

FIG. 2 illustrates a cutaway side view of a connector insert according to an embodiment of the present invention. Connector insert 110 can accept a tongue 510 of a connector receptacle 122 (shown in FIG. 5.) Contacts 924 (shown in FIG. 12) on contacting portions 222 in connector insert 110 can mate with contacts (not shown) on tongue 510 when connector insert 110 is mated with connector receptacle 122. Contacts 924 in connector insert 110 can be multi-structure contacts. In this example, these contacts 924 can include a metal layer (not shown) on traces 1322 (shown in FIG. 13) on contacting portions 222 of flexible circuit board 220, which can be attached to spring fingers 210. These multi-structure contacts can be located in a top and bottom of a passage in connector insert 110 (or 900 as shown in FIG. 10.) In these and other embodiments of the present invention, these contacts can be located in either a top or bottom of the passage in connector insert 110 (or 900 as shown in FIG. 10.) Spring fingers 210 can be supported by housings 212. Contacting portions 222 can be electrically isolated by shield 240. Shield 240 can electrically connect to rear shield 242. Flexible circuit boards 220 can connect to boards 250. Flexible circuit boards 220 can be multilayer or single layer flexible circuit boards. Boards 250 can be supported by housing 230. Contacts 252 on boards 250 can electrically connect to route paths 260. Route paths 260 can be wires, such as wires in a cable, additional flexible circuit boards, or other routing structures.

Spring fingers 210 can each support individual contacting portions 222, they can each support two contacting portions 222, or they can support more than two contacting portions 222. Spring fingers 210 can be in contact with shield 240 or they can be separate from shield 240.

More specifically, in these and other embodiments of the present invention, each spring finger 210 can provide support for one contacting portion 222 of a flexible circuit board 220. This arrangement can work well to ensure that each contact 924 on a contacting portion 222 of flexible circuit board 220 has a force to push it against a corresponding contact (not shown) when the contact 924 on the contacting portion 222 of the flexible circuit board 220 is mated with the corresponding contact.

In these and other embodiments of the present invention, each spring finger 210 can provide support for two contacting portions 222 of a flexible circuit board 220. Having two contacting portions 222 supported by each spring finger 210 can help to ensure that each contact 924 on a contacting portion 222 of flexible circuit board 220 has a force to push it against a corresponding contact when the contact 924 on the contacting portion 222 of the flexible circuit board 220 is mated with the corresponding contact.

In these and other embodiments of the present invention, each spring finger 210 can provide support for contacts 924 on more than two contacting portions 222 of a flexible circuit board 220. For example, each spring finger 210 can provide support for each of the contacts 924 on the flexible circuit board 220. Having a limited number of spring fingers 210 can help to simplify the assembly and manufacturing of components for a connector insert 110.

Spring fingers 210 can be conductive. Spring fingers 210 can be held in place by being partially encased in, or attached to, housing 212. Housing 212 can be formed of plastic, a ferritic or other magnetic material (to form a magnetic element), or other conductive or nonconductive material. Spring fingers 210 can be held in place by being attached to, or formed as part of, a shield around the connector, or a housing in the connector. Spring fingers 210 can be formed of steel, copper, bronze, spring steel, stainless steel, ceramic, or other material. Spring fingers 210 can be formed by stamping, metal-injection molding, forging, deep drawing, or other process.

In these and other embodiments of the present invention, spring fingers 210 can be nonconductive. Spring fingers 210 can be held in place by being partially encased or formed with housing 212. Spring fingers 210 can be attached to flexible circuit boards 220 using a pressure-sensitive adhesive, heat activated adhesive, temperature-sensitive adhesive, or other adhesive, laser or spot welding, or other material or process. Spring fingers 210 can be made of plastic, LCPs, rubber, foam, or other material. Spring fingers 210 can be formed by molding, injection molding, or other process. Housing 230 can be formed of plastic, and can be formed by injection molding or other process.

In these and other embodiments of the present invention, flexible circuit boards 220 can connect to boards 250. Route paths in flexible circuit boards 220 can electrically connect to traces in boards 250, which can terminate in contacts 252. Contacts 252 can be located on boards 250. In these and other embodiments of the present invention, flexible circuit boards 220 can instead bypass boards 250 and connect to route paths 260 via contacts 252, which can be located on flexible circuit boards 220.

In these and other embodiments of the present invention, route paths 260 can be routed in different directions. This can allow connector insert 110 to have cable that extends from connector insert 110 at a right angle or other angle to a contacting direction that connector insert 110 is inserted into connector receptacle 122 (shown in FIG. 5.)

Figure 3:
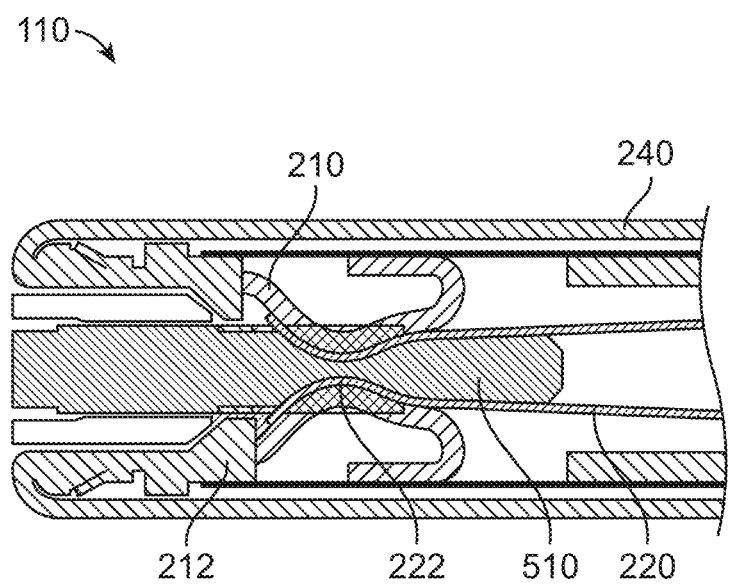
FIG. 3 illustrates a front portion of a connector insert according to an embodiment of the present invention.

FIG. 3 illustrates a front portion of a connector insert according to an embodiment of the present invention. Again, contacts 924 (shown in FIG. 12) on contacting portions 222 of connector insert 110 can mate with contacts (not shown) on top and bottom surfaces of tongue 510. Contacts 924 on contacting portions 222 can be formed on surfaces of flexible circuit boards 220, or attached to traces on surfaces of flexible circuit board 220. Spring fingers 210 can mechanically support contacting portions 222 of flexible circuit boards 220. Housing 212 can support spring fingers 210. Shield 240 can electrically isolate contacting portions 222.

In these multi-structure contacts, spring fingers 210 can provide mechanical support and contacting force for contacts 924 on contacting portions 222. That is, the spring fingers might not actually convey signals or power but instead can be utilized to provide a good mechanical electrical connection between contacts in mated connectors. Since signals are not routed through spring fingers 210, they can be formed of materials that are selected to provide a good spring force without regard to their conductivity. Since the remaining structures in the multi-structure contacts are not required to provide a spring force, contacts 924 on flexible circuit board 220 can convey signals for the connector insert 110. Contacts 924 on contacting portions 222 can connected to traces (not shown) of flexible circuit board 220. Flexible circuit board 220 can be a multilayer flexible circuit board to help improve signal quality. The traces of flexible circuit board 220 can use the multiple layers to provide matched traces, shielding, strip-lining, and other routing structure that can be used to improve signal quality and signal integrity. These routing techniques can reduce cross-talk, reduce electromagnetic interference, and enable a high data rate. Also, since the traces of flexible circuit board can begin (terminate) at contacting portions 222, stubs, which can be located at an end of a traditional beam contact, can be reduced or eliminated for further improved high-frequency performance.

By forming contacts in this way, traditional beam contacts are not needed. The absence of these beam contacts can result in free space inside a connector insert. This space can be used for components, which can be located on flexible circuit boards 220, boards 250, route paths 260, or elsewhere connector insert. The ability to locate components on these boards directly can enable the elimination of a paddle board that can otherwise be needed. The use of a boot over the paddle board can similarly be eliminated.

In these and other embodiments of the present invention, one or more magnets can also be located in the connector insert. An example is shown in the following figure.

Figure 4:
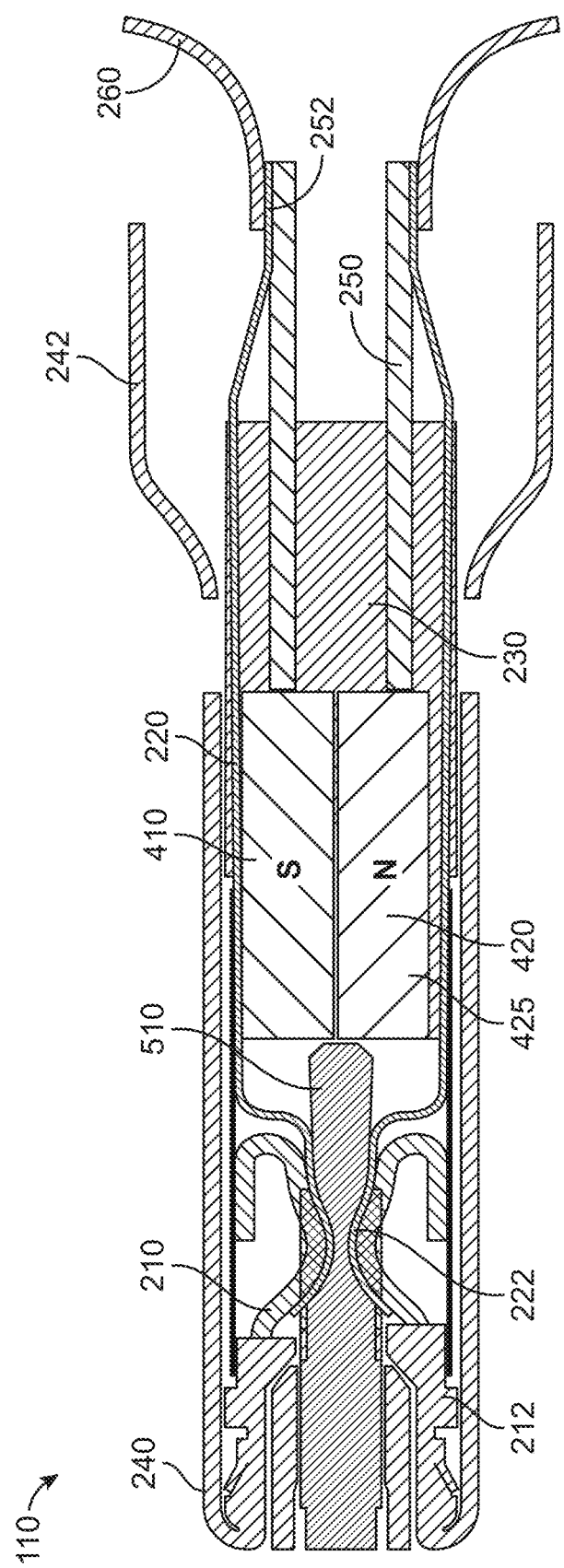
FIG. 4 illustrates another connector insert according to an embodiment of the present invention.

FIG. 4 illustrates another connector insert according to an embodiment of the present invention. As before, contacts 924 (show in FIG. 12) on contacting portions 222 on flexible circuit boards 220 can electrically connect to contacts (not shown) on tongue 510. Flexible circuit boards 220 can be attached to surfaces of spring fingers 210. Spring fingers 210 can be supported by housing 212. Flexible circuit boards 220 can terminate at contacts 252 on boards 250 and signals on flexible circuit boards 220 can be routed by route paths 260.

Again, the absence of beam contacts can provide additional space in connector insert 110. In this example, a magnet 425 can be included in connector insert 110. This magnet 425 can include a south pole 410 and a north pole 420. The south pole 410 and north pole 420 can attract a magnetic element (not shown) on tongue 510. For example, tongue 510 can include a metal-injection molded frame, where the injected metal forms a magnetic element. This can help to secure connector insert 110 in place in connector receptacle 122. An example is shown in the following figure.

Figure 5:
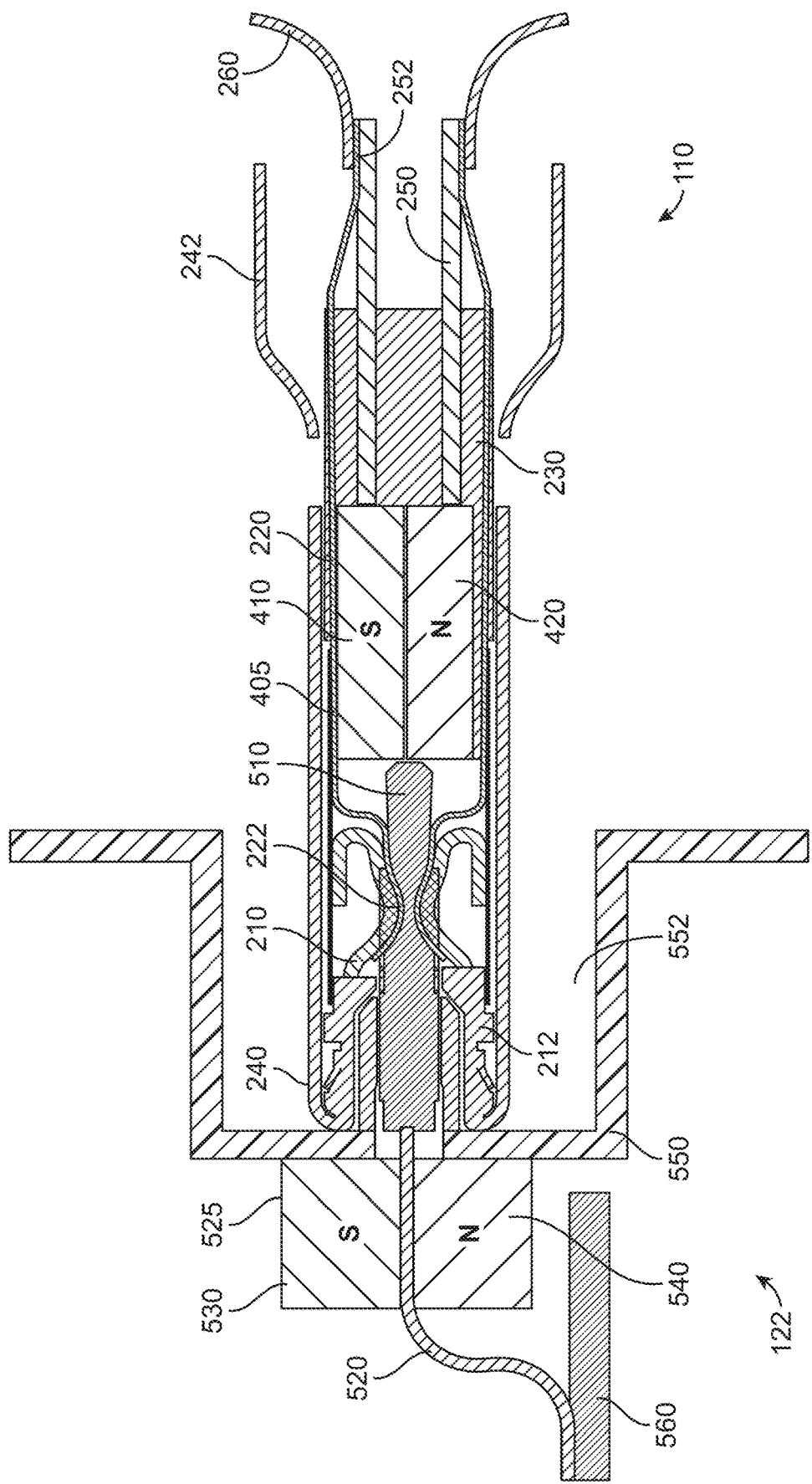
FIG. 5 illustrates a connector system according to an embodiment of the present invention.

FIG. 5 illustrates a connector system according to an embodiment of the present invention. In this example, connector insert 110 can be inserted in recess or passage 552 in device enclosure or receptacle housing 550, which can be the same or similar to device enclosure 102 in FIG. 1. Device enclosure or receptacle housing 550 can at least substantially house an electronic device that includes connector receptacle 122. Device enclosure or receptacle housing 550 can instead be a housing for connector receptacle 122.

As before, connector insert 110 can include contacts 924 (show in FIG. 12) on contacting portions 222 that can physically and electrically connect to contacts (not shown) on tongue 510 of connector receptacle 122. Contacts 924 can be formed on contacting portions 222. Contacting portions 222 can be supported by spring fingers 210, which can be supported by housing 212. In this example housing 212 can include a magnetic element (not shown.) Flexible circuit boards 220 can terminate at contacts 252 on board 250. Route paths 260 can be connected to contacts 252. Connector insert 110 can include shield 240.

Connector insert 110 can be mated with connector receptacle 122. Connector receptacle 122 can include a magnet 525 having a south pole 530 and a north pole 540. Route paths 520 can be connected to tongue 510 and can be attached to board 560.

In this example, magnet 405 in connector insert 110 can electrically attract a magnetic element (not shown) on tongue 510 of connector receptacle 122. For example, tongue 510 can include a metal-injection molded frame, where the injected metal forms a magnetic element. Magnet 525 in connector receptacle 122 can electrically attract a magnetic element (not shown) in housing 212. This can help to secure connector insert 110 in place with connector receptacle 122. These magnets can also provide a tactile response to a user when inserting connector insert 110 into connector receptacle 122.

These multi-structure contacts can be used in various ways in connectors consistent with embodiments of the present invention. For example, these multi-structure contacts can be used as contacts in a connector receptacle where the multi-structure contacts directly and electrically connect to contacts on a tongue of a connector insert. An example is shown in the following figure.

Figure 6:
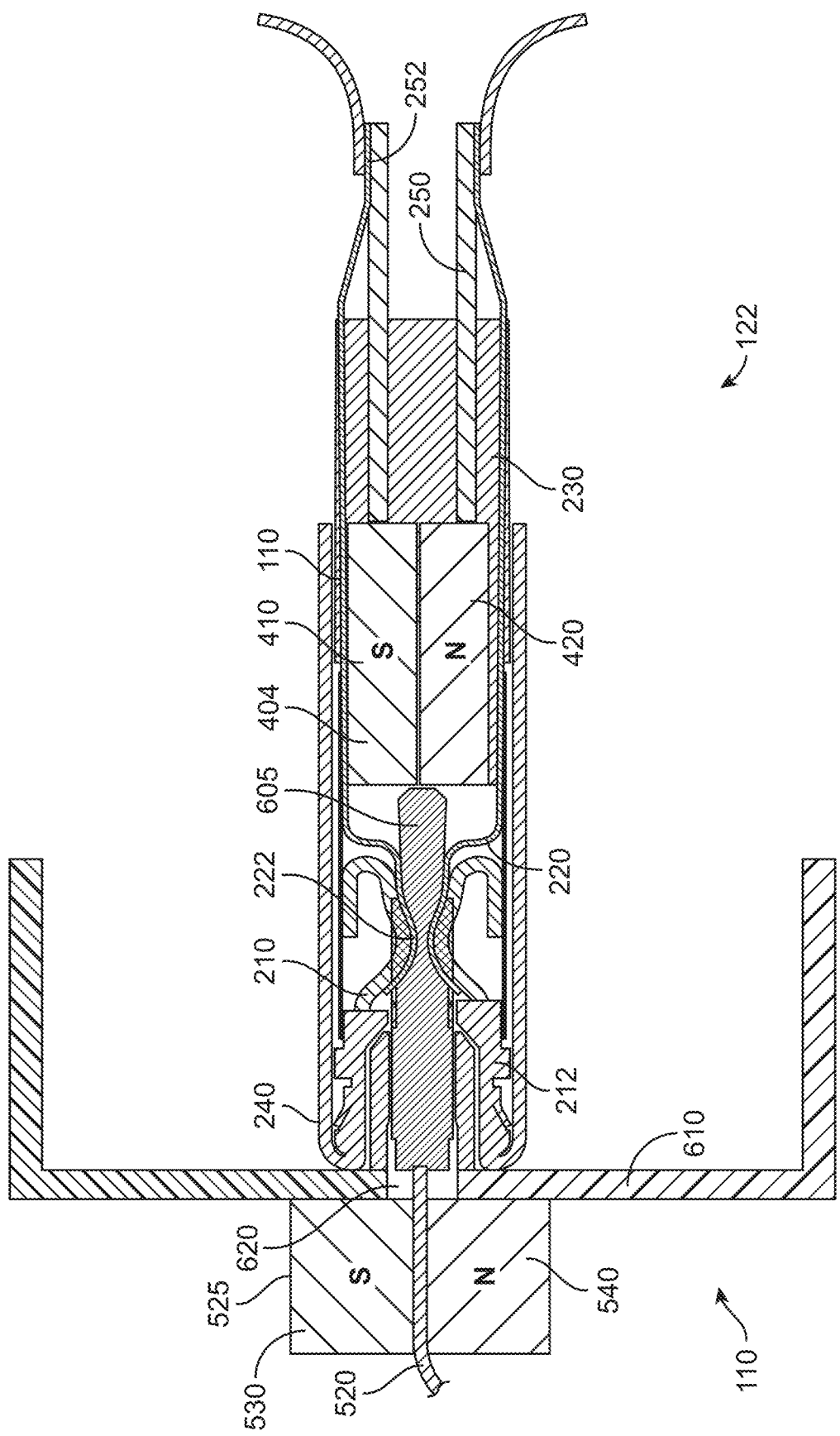
FIG. 6 illustrates another connector system according to an embodiment of the present invention.

FIG. 6 illustrates another connector system according to an embodiment of the present invention. In this example, connector insert tongue 605 can be mated with connector receptacle 122, which can be located in device enclosure 610, which can be the same or similar as device enclosure 102 in FIG. 1. Device enclosure 610 can instead be a housing for connector receptacle 122. Connector insert 110 can include magnet 525, route paths 520, and tongue 510. A housing (not shown) can support magnet 525.

Connector receptacle 122 can be part of an electronic device that can be at least substantially housed by device enclosure 610. Connector receptacle 122 can include contacts 924 (shown in FIG. 12) on contacting portions 222 that can physically and electrically connect to contacts (not shown) on tongue 605 of connector insert 110. Contacts 924 on contacting portions 222 can be formed on flexible circuit boards 220. Contacting portions 222 can be supported by spring fingers 210, which can be supported by housing 212. In this example housing 212 can include a magnetic element (not shown.) Flexible circuit boards 220 can terminate at contacts 252 on board 250. Route paths 260 can be connected to contacts 252. Connector receptacle 122 can be at least partially shielded by shield 240.

Again, these multi-structure contacts can be used in various ways in connectors consistent with embodiments of the present invention. For example, these multi-structure contacts can be used as contacts on a tongue of a connector insert where the multi-structure contacts directly and electrically connect to contacts in a connector receptacle when the connector insert and connector receptacle are mated. An example is shown in the following figure.

Figure 7:
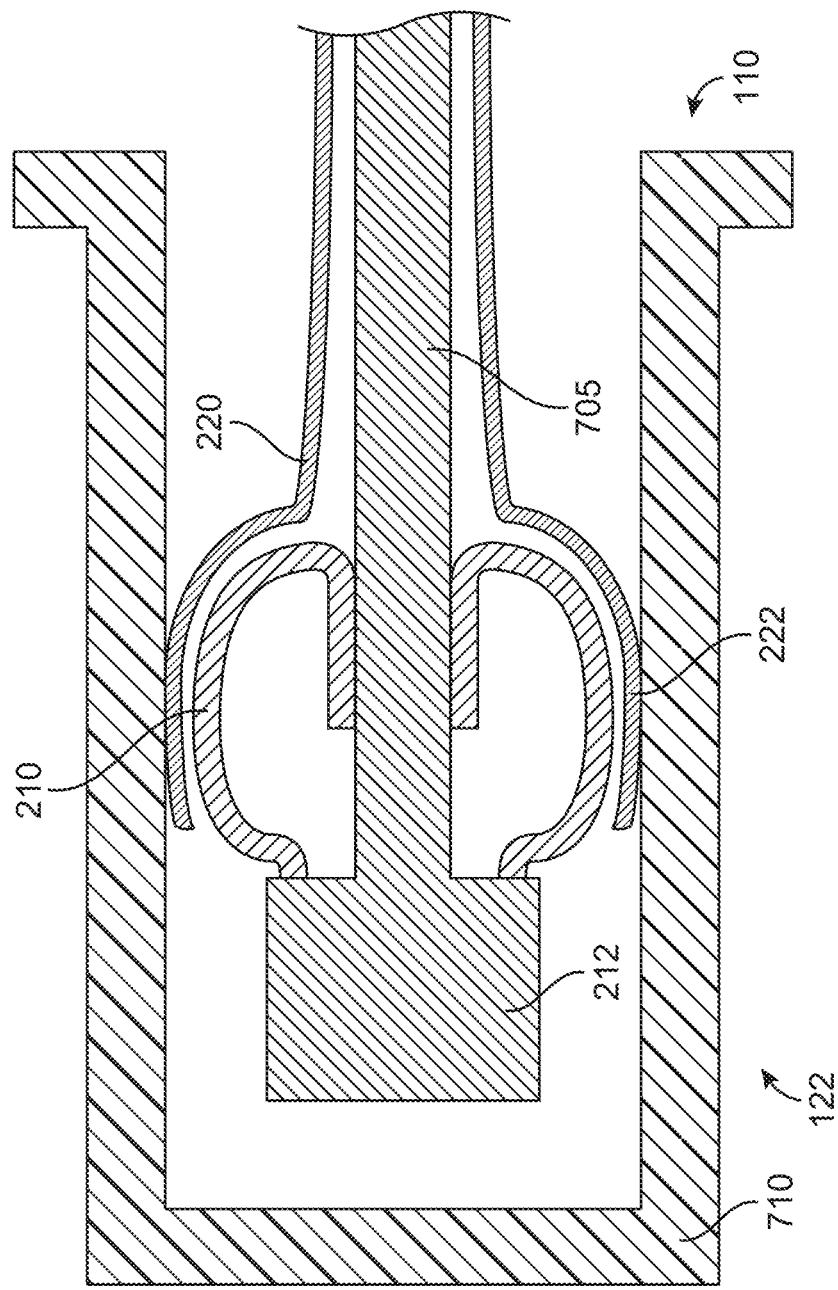
FIG. 7 illustrates another connector system according to an embodiment of the present invention.

FIG. 7 illustrates another connector system according to an embodiment of the present invention. In this example, connector insert 110 can include contacting portions 222 on flexible circuit boards 220. Flexible circuit boards 220 can be supported by spring fingers 210 on tongue 510. Spring fingers 210 can be supported by tongue portion or housing 212, which can be located on, or can be part of, tongue 705. Contacts 924 (shown in FIG. 12) on contacting portions 222 can physically and electrically contact connector receptacle contacts (not shown). These connector receptacle contacts can be supported by device enclosure 710. Device enclosure 710 can at least substantially house an electronic device that includes connector insert 110. Device enclosure 710 can instead be a portion of a housing for connector receptacle 122.

Again, these multi-structure contacts can be used in various ways in connectors consistent with embodiments of the present invention. For example, these multi-structure contacts can be used as contacts on a tongue of a connector receptacle where the multi-structure contacts directly and electrically connect to contacts in a connector insert when the connector insert and connector receptacle are mated. An example is shown in the following figure.

Figure 8:
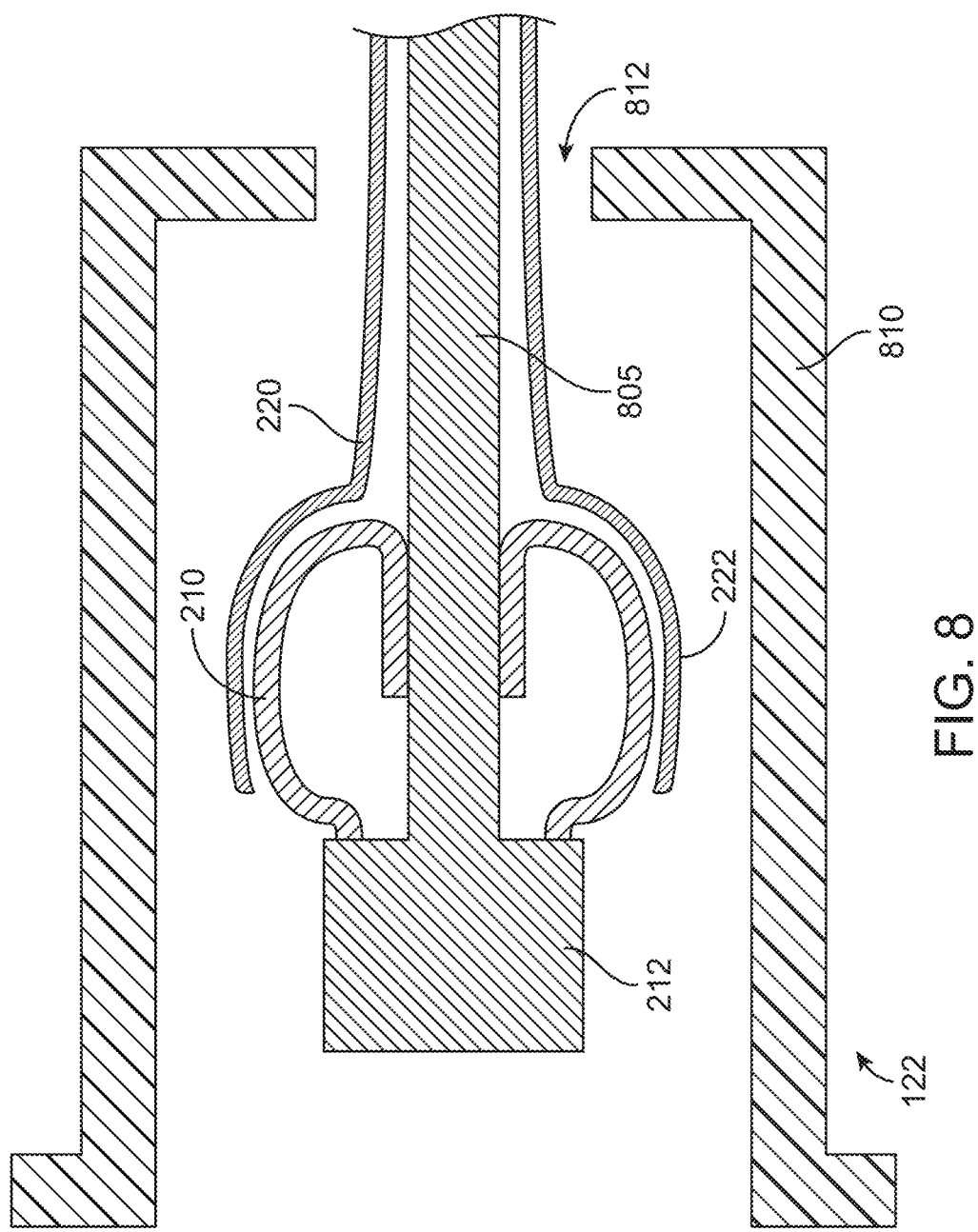
FIG. 8 illustrates a connector receptacle according to an embodiment of the present invention.

FIG. 8 illustrates a connector receptacle according to an embodiment of the present invention. In this example, connector receptacle 122 can include contacting portions 222 on flexible circuit boards 220. Flexible circuit boards 220 can be supported by spring fingers 210 on tongue 805. Spring fingers 210 can be supported by tongue portion or housing 212. Contacts 924 (show in FIG. 12) on contacting portions 222 can physically and electrically contact connector receptacle contacts (not shown). Tongue 805 can emerge from an opening 812 in device enclosure 810. Device enclosure 810 can at least substantially house an electronic device that includes connector receptacle 122. Device enclosure can be the same or similar to device enclosure 102 in FIG. 1. Device enclosure 810 can instead be a portion of a housing for connector receptacle 122.

Figure 9:
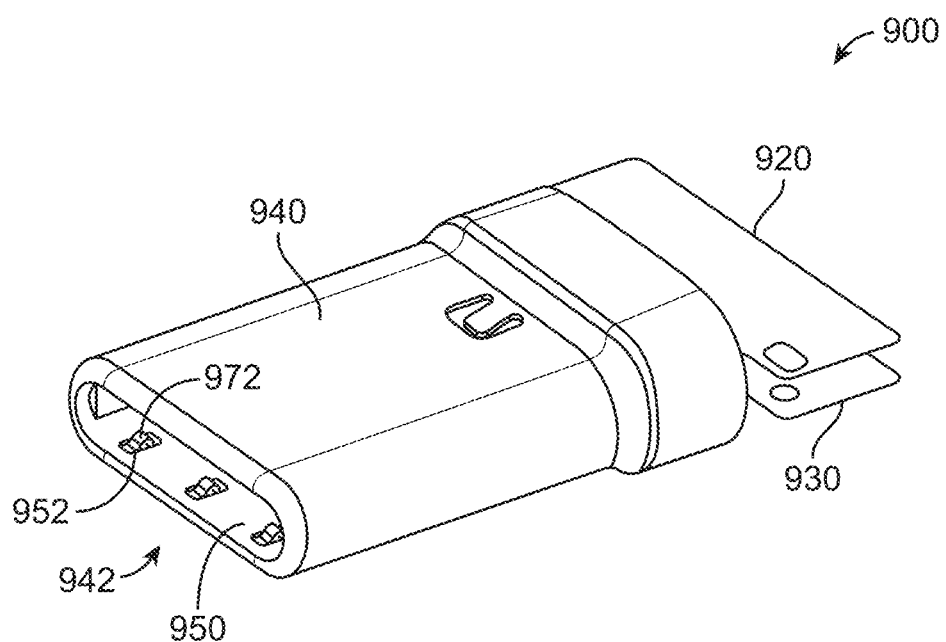
FIG. 9 illustrates another connector insert according to an embodiment of the present invention.

FIG. 9 illustrates another connector insert according to an embodiment of the present invention. Connector insert 900 can be a USB type C connector insert, though embodiments of the present invention can be incorporated in other types of connector inserts and connector receptacles. Connector insert 900 can be used as connector insert 124 in FIG. 1. Connector insert 900 can include housing 950 having openings 952 for ground contacts 972. Housing 950 can be formed of plastic or other nonconductive material, and can be formed by injection molding or other process. Housing 950 can be shielded by shield 940. Shield 940 can be metallic or otherwise conductive and can be formed by stamping, 3-D printing, deep-drawing, forging, molding, or other process. Shield 940 and housing 950 can have front opening 942. Front opening 942 can accept a tongue of a corresponding connector receptacle (not shown) and shield 940 can electrically connect to ground contacts (not shown) in the connector receptacle when connector insert 900 and the corresponding connector receptacle are mated. Flexible circuit boards 920 and 930 can be routed from a back end of connector insert 900.

FIG. 10 is an exploded view of the connector insert of FIG. 9. Connector insert 900 can include housing 950. Housing 950 can support side ground contacts 960 in slots 956. Side ground contacts 960 can include contacting portions 962 that can physically and electrically connect to contacts on the side of a tongue (not shown) in a corresponding connector receptacle (not shown.) Housing 950 can further support ground contact structures 970 in slots 954. Ground contact structures 970 can include ground contacts 972 that can be exposed at openings 952 of housing 950. Ground contacts 972 can physically and electrically connect to ground pads (not shown) on the tongue of the corresponding connector receptacle. Housing 950 can further support spring fingers 910 and 912 at notches 957.

In this example, spring fingers 910 and 912 can be the same or substantially similar to spring fingers 210 shown above, and they can be formed, operate, and be used in the same or similar manners.

Spring fingers 910 and 912 can each support individual contacting portions 922 and 932, they can each support two contacting portions 922 and 932, or they can support more than two contacting portions 922 and 932. Spring fingers 910 and 912 can be in contact with shield 940 or they can be separate from shield 940.

More specifically, in these and other embodiments of the present invention, each spring finger 910 and 912 can provide support for one contacting portion 922 and 932 of flexible circuit board 920 and 930. This arrangement can work well to ensure that each contact 924 on a contacting portion 922 or 932 of flexible circuit boards 920 and 930 has a force to push it against a corresponding contact (not shown) when each contact 924 on the contacting portions 922 and 932 of the flexible circuit boards 920 and 930 is mated with the corresponding contact.

In these and other embodiments of the present invention, each spring finger 910 and 912 can provide support for two contacting portions 922 and 932 of flexible circuit boards 920 and 930. Having two contacting portions 922 and 932 supported by each spring finger 910 and 912 can help to ensure that each contact 924 on a contacting portion 922 and 932 of flexible circuit boards 920 and 930 has a force to push it against a corresponding contact when each contact 924 on the contacting portions 922 and 932 of flexible circuit boards 920 and 930 is mated with the corresponding contact.

In these and other embodiments of the present invention, each spring finger 210 can provide support for contacts 924 on more than two contacting portions 222 of a flexible circuit board 220. For example, each spring finger 910 and 912 can provide support for each of the contacts 924 on flexible circuit boards 920 and 930. Having a limited number of spring fingers 910 and 912 can help to simplify the assembly and manufacturing of components for a connector insert 900.

In this example, spring fingers 910 and 912 can be individual spring fingers, though in these and other embodiments of the present invention, some or all of the spring fingers 910 and 912 can be joined. Similarly, each contacting portion 922 and 932 can be separate as shown, or some of all of contacting portions 922 and 932 can be joined. Each spring finger 910 and 912 can support one, two, three, or more contacting portions 922 and 932 of flexible circuit boards 920 and 930. Spring fingers 910 and 912 can be connected by connecting pieces 914.

In these and other embodiments of the present invention, spring fingers 910 (and 912) and contacting portions 922 (and 932) can be arranged in various ways. Again, each spring finger 910 can support one, two, three, or more contacting portions 922. Each contacting portion 922 can support one or more contacts 924. For example, a spring finger 910 may support a contacting portion 922 having one contact 924. A spring finger 910 may support a contacting portion 922 having two contacts 924. A single spring finger 910 can support a single contacting portion 922 having all the contacts 924 of a row. Other configurations are also possible.

Spring fingers 910 and 912 can be conductive. Spring fingers 910 and 912 can be held in place by being partially encased in, or attached to, housing 950. Spring fingers 910 and 912 can be held in place by being attached to, or formed as part of, a shield around the connector, or a housing in the connector. Spring fingers 910 and 912 can be formed of steel, copper, bronze, spring steel, stainless steel, ceramic, or other material. Spring fingers 910 and 912 can be formed by stamping, metal-injection molding, forging, deep drawing, or other process.

In these and other embodiments of the present invention, spring fingers 910 and 912 can be nonconductive. Spring fingers 910 and 912 can be held in place by being partially encased or formed with housing 950. Spring fingers 910 and 912 can be formed as part of the housing 950 for the connector. Spring fingers 910 and 912 can be attached to flexible circuit boards 920 and 930 using a pressure-sensitive adhesive, heat activated adhesive, temperature-sensitive adhesive, or other adhesive, laser or spot welding, or other material or process. Spring fingers 910 and 912 can be made of plastic, LCPs, rubber, foam, or other material. Spring fingers 910 and 912 can be formed by molding, injection molding, or other process.

Flexible circuit boards 920 and 930 can include contacting portions 922 and 932 that can be aligned and fixed to spring fingers 910 and 912. Contacting portions 922 can be adhesively attached to spring fingers 910, while contacting portions 932 can be adhesively attached to spring fingers 912. Keeping spring fingers 910 and 912 separate and not joined can improve the planarization of contacts 924 (shown in FIG. 13) on contacting portions 922 and 932 of flexible circuit boards and 20 and 930. Housing 950 can be enclosed in shield 940. Shield 940 and housing 950 can include front opening 942 for accepting the tongue of the corresponding connector receptacle.

Figure 11:
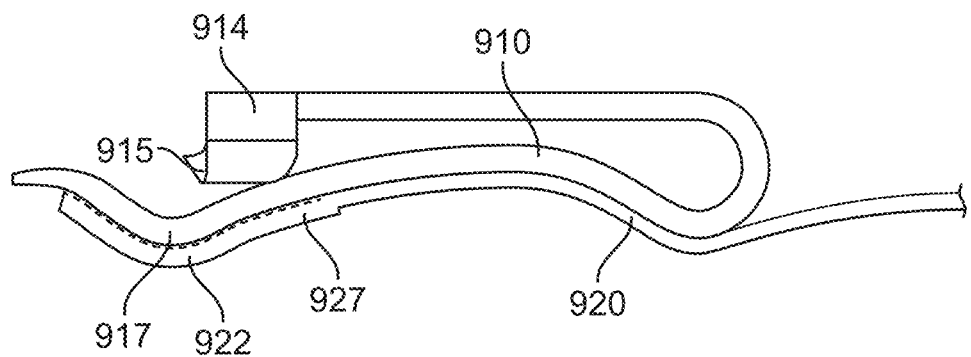
FIG. 11 is a cutaway side view of a portion of the connector insert of FIG. 9.

FIG. 11 is a cutaway side view of a portion of the connector insert of FIG. 9. In this example, spring finger 910 can be attached to notch 957 on housing 950 (shown in FIG. 10) by tab 915 on connecting piece 914. Flexible circuit board 920 can include a thicker portion 927 for durability reasons. Thicker portion 927 of flexible circuit board 920 can include a contacting portion 922 over contacting point 917 of spring finger 910. A contact 924 (shown in FIG. 13) can be formed over contacting point 917 and can extend over some or all of thicker portion 927. In these and other embodiments of the present invention, thicker portion 927 can be omitted, and flexible circuit board 920 can have a uniform width along the length of spring finger 910.

In these and other embodiments of the present invention, signals can be routed from contacts on a flexible circuit board to a second flexible circuit board, printed circuit board, or other appropriate substrate. An example of how this can be done is shown in the following figure.

Figure 12:
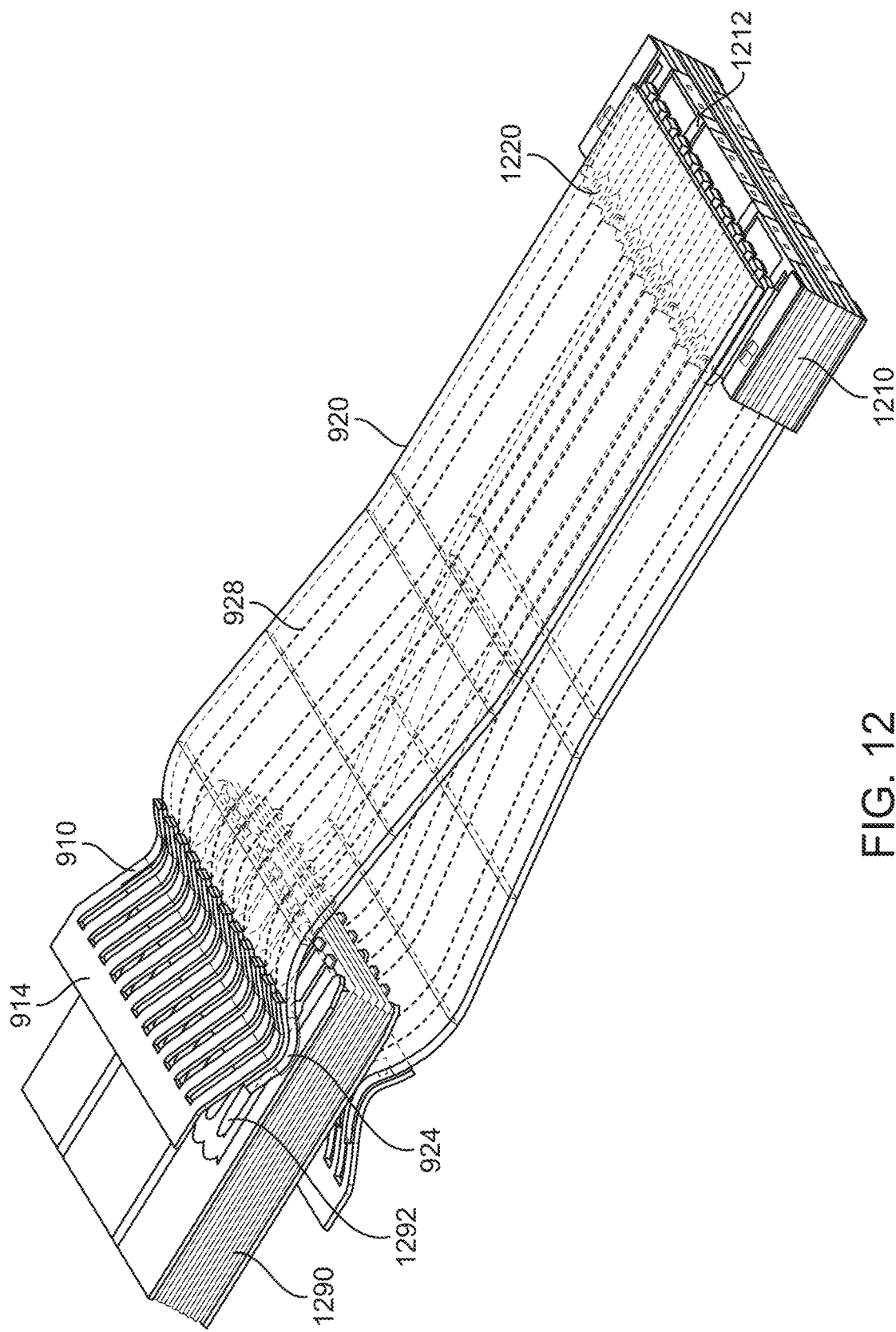
FIG. 12 illustrates a portion of a connector insert and associated structures according to an embodiment of the present invention.

FIG. 12 illustrates a portion of a connector insert and associated structures according to an embodiment of the present invention. In this example, spring fingers 910 can be joined by connecting piece 914. Spring fingers 910 can provide support for contacting portions 922 (shown in FIG. 11) of flexible circuit board 920. Contacts 924 can be formed on a bottom surface of flexible circuit board 920. Contacts 924 can make electrical connections with contacts 1292 on tongue 1290. Tongue 1290 can be a tongue of a corresponding connector receptacle (not shown) that is mated to this connector insert. Contacts 924 can electrically connect to traces 928 in flexible circuit board 920. Some or all of traces 928 can connect to traces (not shown) in printed circuit board 1210 through vias 1220. Some or all of traces 928 can instead connect through vias 1220 to traces 1212 on a surface of printed circuit board 1210.

Again, flexible circuit boards 220, 920, and 930 can be multilevel flexible circuit boards. An example is shown in the following figure. In this example, bottom, middle, and top layers of a flexible circuit board can be included.

Figure 13:
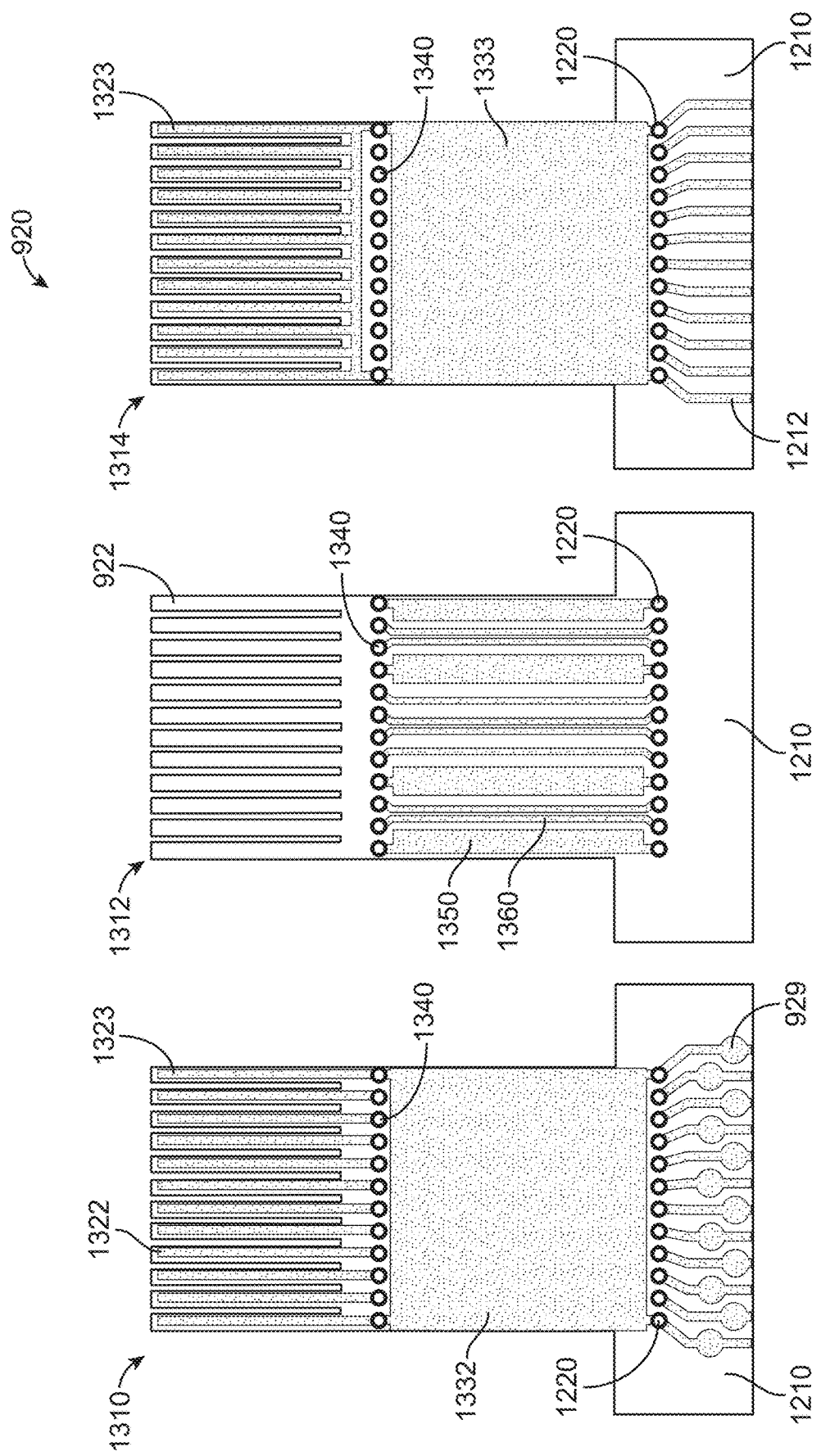
FIG. 13 illustrates layers of a multilevel flexible circuit board according to an embodiment of the present invention.

FIG. 13 illustrates layers of a multilevel flexible circuit board according to an embodiment of the present invention. In this example, flexible circuit board 920 (which can be the same as flexible circuit boards 220 and 930) can include a bottom layer 1310, a middle layer (shown here as Layer 2) 1312, and a top layer 1314. In these and other embodiments of the present invention, one or more of these layers can be omitted or one or more other layers can be added. Contacts 924 (shown in FIG. 12) can be attached to traces 1322 and 1323 on contacting portions 922. Contacts 924 can be soldered, attached by adhesive, or attached in other ways to contacting portions 922. For example, pressure-sensitive adhesive, heat activated adhesive, temperature-sensitive adhesive, or other adhesive can be used. Traces 1322 and 1323 can electrically connect to vias 1340. Vias 1340 can electrically connect to each other on bottom layer 1310, middle layer 1312, and top layer 1314, and can provide a routing path for signals on traces 1322 to reach traces 1350 and 1360 on middle layer 1312. r traces 1350 can be used by ground or power supplies, while the narrower traces 1360 can be used for signals, such as high-speed differential signals. Ground plane 1332 on bottom layer 1310 and ground plane 1333 on top layer 1314 can shield traces 1360. Traces 1323 can electrically connect to ground plane 1332 and ground plane 1333. Traces 1350 and 1360 can connect to vias 1220. Vias 1220 can connect to each other on bottom layer 1310, middle layer 3012, and top layer 1314. Vias 1220 can connect to vias 929 on printed circuit board 1210. Vias 929 can connect to route paths on different layers (not shown) in printed circuit board 1210. Vias 1220 can also connect to traces 1212.

In this way, high-speed differential signals conveyed by flexible circuit board 920 can be well-shielded. This shielding can protect the differential signals being conveyed on flexible circuit board 920 and can prevent differential signals being conveyed on flexible circuit board 920 from coupling to other signals or circuits. For example, a differential signal can be conveyed on two traces 1322 to two vias 1340 on bottom layer 1310. The differential signal can then be conveyed on two of the traces 1360. Each pair of traces 1360 can be shielded by ground or power supplies on traces 1350, as well as ground plane 1332 on bottom layer 1310 and ground plane 1333 on top layer 1314. The short distance between contacts 924 on traces 1322 and the vias 1340 can also help to shield the differential signals by allowing ground plane 1332 on bottom layer 1310 and ground plane 1333 on top layer 1314 to extend close to contacts 924.

The additional shielding provided by placing ground planes 1332 and 1333 close to the contacts 924 means that the connector has a shorter region where the signals conveyed by contacts 924 are not carried on a transverse electromagnetic (TEM) transmission line. A TEM transmission line (for example the stripline as shown here) has a well-defined impedance with less variation, giving much better return loss, less crosstalk, less mode conversion, and lower insertion loss.

Since the TEM transmission line can be positioned close to contacts 924, the non-TEM zone (unshielded length of traces 1360) of the signal path for signals conveyed by contacts 924 can be made short. This can provide several benefits. It can push the onset of a given level of near-end cross-talk (NEXT) and far-end cross-talk (FEXT) coupling to higher frequencies, moving significant coupling above the operating frequency (the data rate of the signals conveyed by contacts 924.) For example, when the non-TEM zone is a first factor shorter, the coupling effects can be moved higher in frequency by approximately the same first factor. By reducing the unshielded length of traces 1360, coupling can be moved above the data rate of the signals they convey.

There can be resonances formed in connectors by a conductor loop on a ground, power supply, or any net which has multiple contacts. These multi-contacts nets can form transmission line resonators due to the shorted loops created in that net. Shortening these loops such that they have a reduced electrical length can push the resonant frequency higher, above the connectors target operating frequency or data rate of signals on traces 1360. Making these loops electrically shorter by a first factor increases the resonance frequencies by approximately the first factor.

The shorter contact region and the strip line structure of the flex circuit can further result in more of the common-mode current finding a path through the flex contacts 924 and traces 1360 as opposed to other structures, such as ground planes 1332 and 1333. This can result in a reduction in common-mode current in the shield, which can reduce EMI proportional to the reduction of common-mode shield current reduction. The design enables a lower common-mode impedance discontinuity by the shorter non-TEM zone. It can also help to maintain symmetry of a ground, differential signal, and power supply pin group. Further, the conductor shape of power supply traces 1350 can be tailored to improve the coupling between the power supply on traces 1350 and ground planes 1332 and 1332.

In these and other embodiments of the present invention, a shape of power supply traces 1350 can be adjusted in a flex assembly, where power supply coupling to ground and other power supply traces might not be easily executed in a traditional pin field. Coupling components, such as capacitors, can also be included to increase coupling. These features can enable common-mode continuity across the connector as the power supply becomes a more effective return path for residual common-mode currents related to the signals on contacts 924 and traces 1360.

The body of the flex between spring fingers 910 (shown in FIG. 12) and contacts 924 can further reduce cross-talk. For example, ground vias (not shown) can be stitched between signal pairs and from traces 1323 on a top layer 1314 of flexible circuit board 920 to ground.

Figure 14:
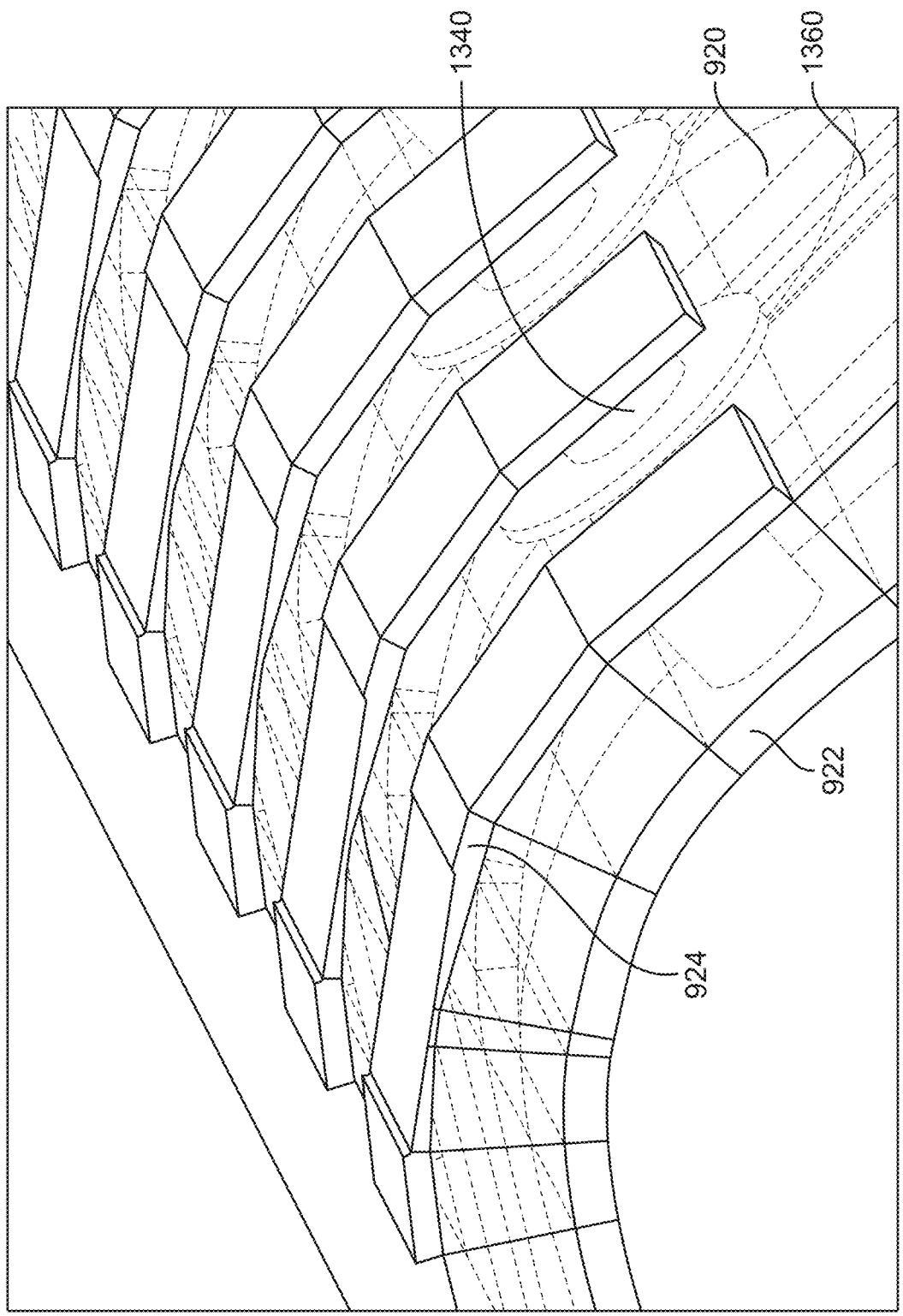
FIG. 14 illustrates contacts on a surface of a flexible circuit board according to an embodiment of the present invention.

FIG. 14 illustrates contacts on a surface of a flexible circuit board according to an embodiment of the present invention. In this example, contacts 924 can be formed on a surface of contacting portions 222 of flexible circuit board 920. Contacts 924 can be plated, formed by vapor deposition, soldered, or formed in other ways on contacting portions 922 of flexible circuit board 920 (and flexible circuit board 220 and 930 in the other examples.) Contacts 924 can be connected through vias 1340 to traces 1360 in flexible circuit board 920. The close position of via 1342 contacts 924 can reduce the length of a trace for which a signal on contact 924 is unshielded by ground planes 1332 and 1333 and traces 1350, as shown in FIG. 13. Contacts 924 can be multi-structure contacts in that they are formed of a metal layer fixed to a metal trace 1322 on a contacting portion 922 of flexible circuit board 920, which can be attached to spring finger 910.

The contacts in these and other embodiments of the present invention can be formed in various ways. Where the contacts are sufficiently substantial, the spring fingers can be omitted. Instead, contacts can be supported by a tongue or other structure of a connector. The contacts can be attached directly to a flexible circuit board in order to support high-speed data transfers and provide a high signal quality.

In one example, a tongue of a connector insert or connector receptacle can include a flexible circuit board having pads on a top and bottom sides. Surface-mount contacting portions of contacts can be soldered to the pads on the flexible circuit board. The contacts on the top side of the flexible circuit board can be held together by a top housing portion and contacts on the bottom side of the flexible circuit board can be held together by a bottom housing portion. Depending on a thickness of the contacts, the top housing portion and the bottom housing portion can perform some or all of the functions of spring fingers. A reinforcement frame can be positioned around a front and sides of the tongue for electromagnetic interference shielding, grounding, and mechanical support. The top housing portion and bottom housing portion can be supported by a tongue molded around the flexible circuit board, the top housing portion, and the bottom housing portion. Such a connector tongue is shown in the following figures.

Figure 15:
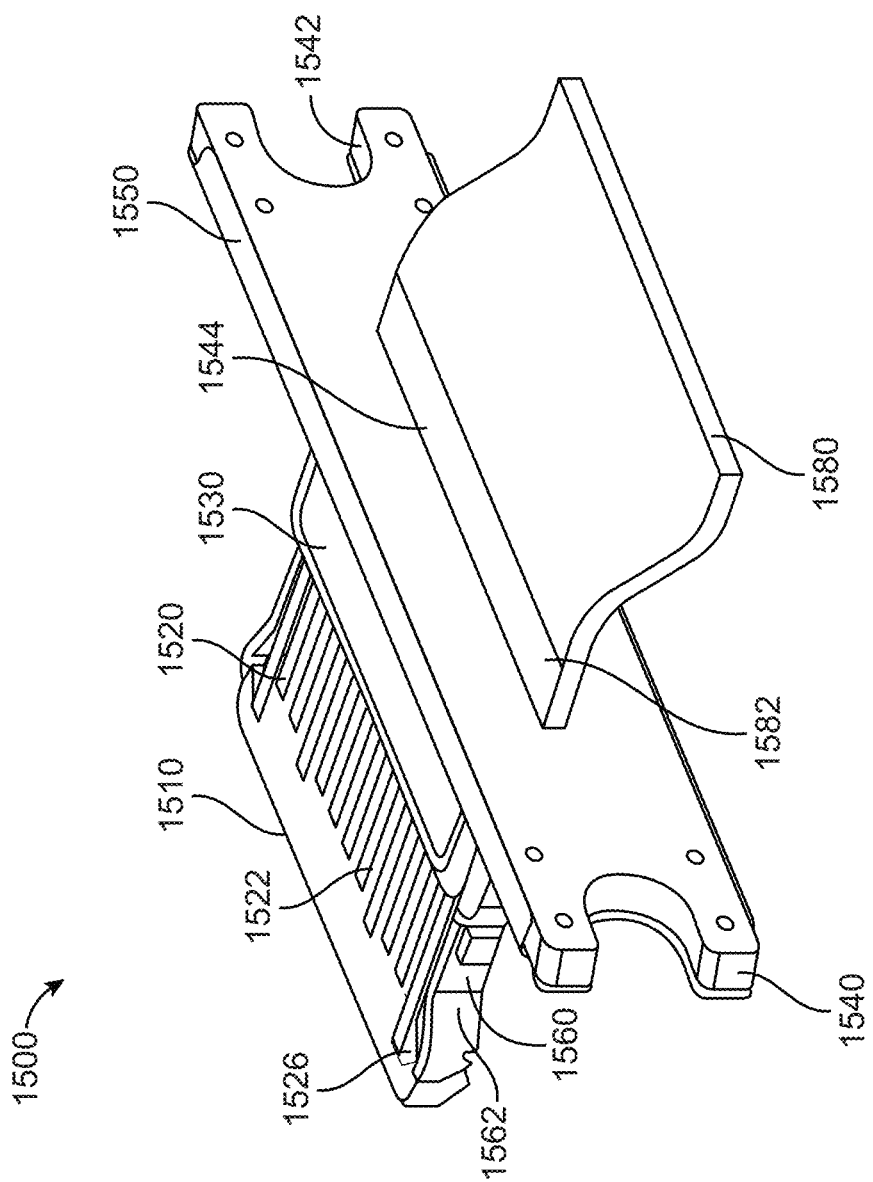
FIG. 15 illustrates a tongue for a connector insert or connector receptacle according to an embodiment of the present invention.

FIG. 15 illustrates a tongue for a connector insert or connector receptacle according to an embodiment of the present invention. Tongue 1500 can include tongue molding 1510 supporting support structure or top housing portion 1526 on a top side of tongue molding 1510 and support structure or bottom housing portion 1576 (shown in FIG. 16) on a bottom side of tongue molding 1510. Top housing portion 1526 can support contacts 1520, while bottom housing portion 1576 can support contacts 1570 (shown in FIG. 16.) Tongue molding 1510 can further support top ground pad 1530 on a top side, and bottom ground pad 1590 (shown in FIG. 16) on a bottom side. Reinforcement frame 1560 can include side ground contacts 1562. Tongue 1500 can further include bracket 1540, which can support backplate 1550. Bracket 1540 can include notches 1542 for fasteners or other structures (not shown) to attach tongue 1500 in place in computer 100 (shown in FIG. 1) or other electronic device. Tongue molding 1510 can include rear opening 1544, which a thickened portion 1582 of flexible circuit board 1580 can pass through or be inserted into. Thickened portion 1582 of flexible circuit board 1580 can be thickened with reinforcing and other layers. In these and other embodiments of the present invention, thickened portion 1582 can be omitted and the reinforcing layers not included. Flexible circuit board 1580 can be the same or similar to, or include the various features of, flexible circuit board 920 (shown in FIG. 13) and the other flexible circuit boards shown herein or provided by embodiments of the present invention.

Contacting surfaces 1522 of contacts 1520 and contacting surfaces 1572 (shown in FIG. 16) of contacts 1570 can physically and electrically connect to contacts of a corresponding connector (not shown) when the corresponding connector is mated with a connector utilizing tongue 1500. Side ground contacts 1562 of reinforcement frame 1560 can physically and electrically contact an inside surface of a shield (not shown) of the corresponding connector when the corresponding connector is mated with a connector utilizing tongue 1500. Top ground pad 1530 and bottom ground pad 1590 can physically and electrically connect to ground contacts (not shown) near an opening (not shown) of the corresponding connector when the corresponding connector is mated with a connector utilizing tongue 1500. Tongue 1500 can be formed in various ways. An example is shown in the following figures.

Figure 16:
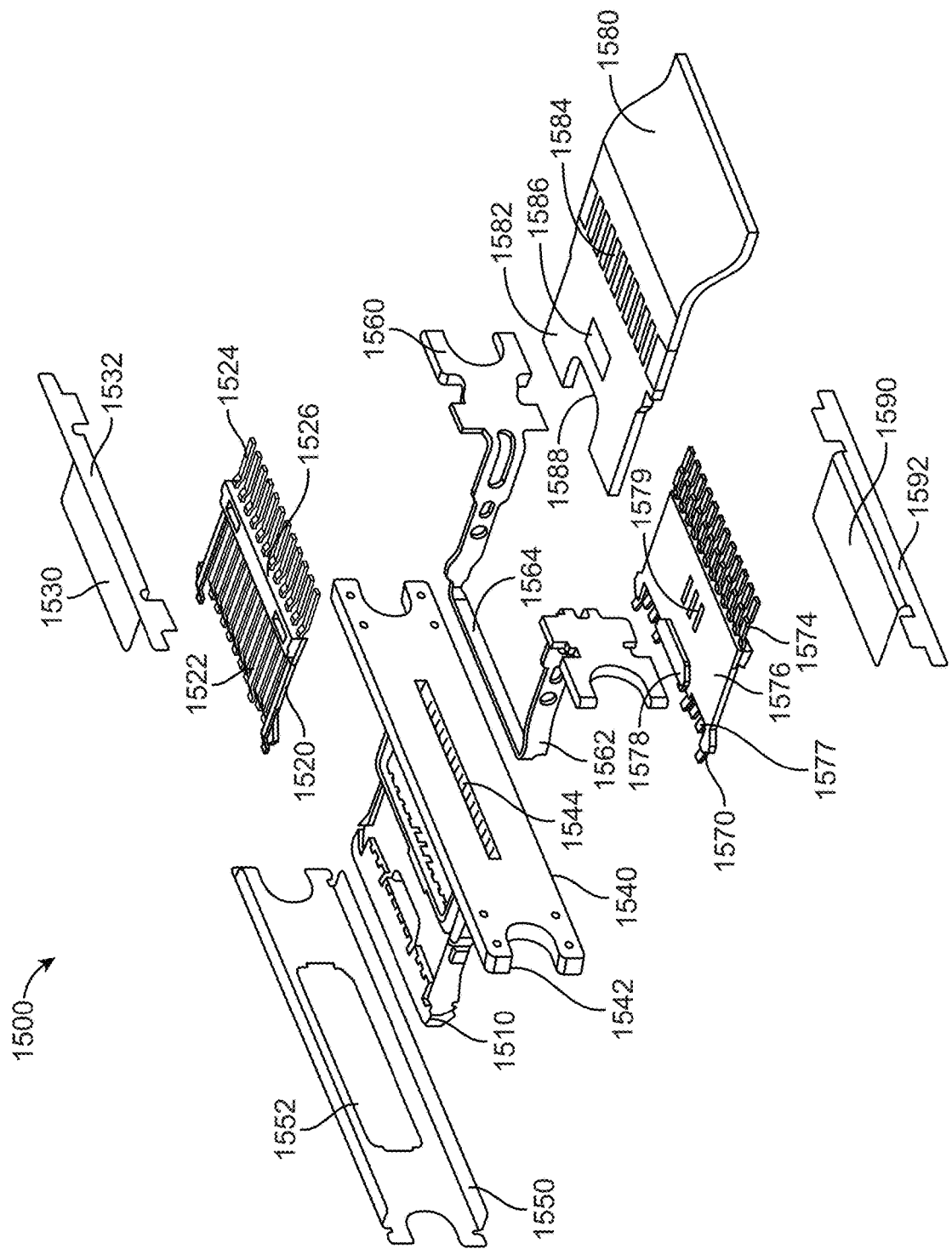
FIG. 16 and FIG. 17 illustrate a method of manufacturing the tongue of FIG. 15 for a connector receptacle or a connector insert according to an embodiment of the present invention.
Figure 17:
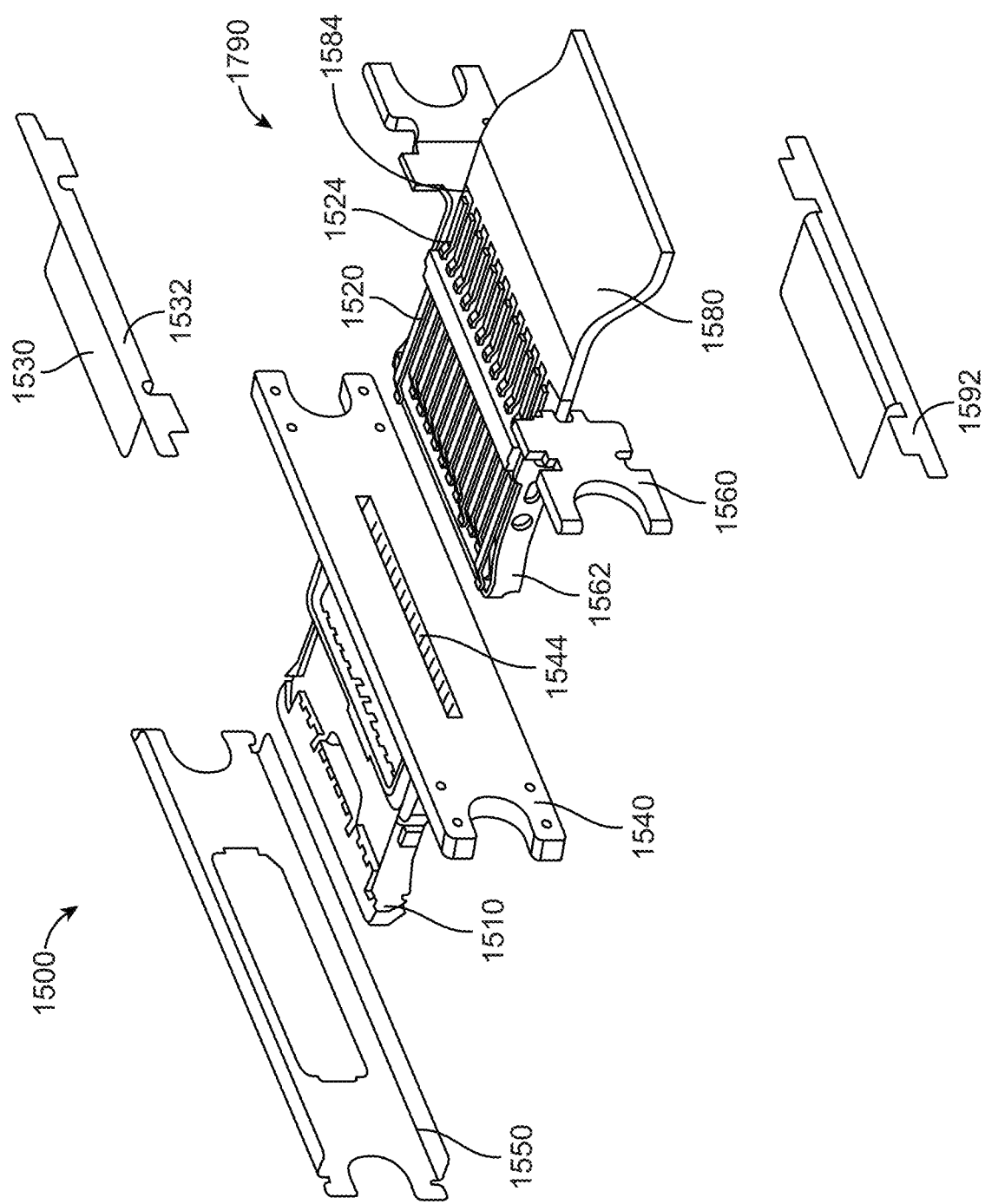

FIG. 16 and FIG. 17 illustrate a method of manufacturing a tongue for a connector receptacle or a connector insert according to an embodiment of the present invention. In FIG. 16, tongue 1500 can include contacts 1520 and contacts 1570. Contacts 1520 can include contacting surfaces 1522 and surface-mount contacting portions 1524. Contacts 1520 can be held in place by top housing portion 1526. Top housing portion 1526 can be molded around portions of contacts 1520. Contacts 1570 can include contacting surfaces 1572 and surface-mount contacting portions 1574. Contacts 1570 can be held in place by bottom housing portion 1576. Bottom housing portion 1576 can be molded around portions of contacts 1570.

Flexible circuit board 1580 can include thickened portion 1582 that can support pads 1584 on a top and bottom side. Thickened portion 1582 can further support liquid-detect contacts 1586 on a top and bottom side. Surface-mount contacting portions 1524 of contacts 1520 can be soldered to pads 1584 on a top side of flexible circuit board 1580, while surface-mount contacting portions 1574 of contacts 1570 can be soldered to corresponding pads 1584 on a bottom side of flexible circuit board 1580, for example by hot-bar soldering, reflow soldering, or other appropriate technique.

Flexible circuit board 1580 can include notch 1588, which can align with tab 1578 on bottom housing portion 1576, as well as a corresponding tab (not shown) on an underside of top housing portion 1526. Portion 1564 of reinforcement frame 1560 can be placed along a front and sides of the structure that includes flexible circuit board 1580, top housing portion 1526, and bottom housing portion 1576. Reinforcement frame 1560 can include side ground contacts 1562. Top ground pad 1530 can be attached to reinforcement frame 1560 using crossbar 1532, while bottom ground pad 1590 can be attached to reinforcement frame 1560 using crossbar 1592 to form assembly structure 1790 (shown in FIG. 17.) Tongue molding 1510 can be formed around assembly structure 1790. Tongue molding 1510 can include rear opening 1544 in bracket 1540. Flexible circuit board 1580 can pass through rear opening 1544. Tongue molding 1510 can be inserted through opening 1552 in backplate 1550. Backplate 1550 can be attached to reinforcement frame 1560, crossbar 1532, and crossbar 1592. Bracket 1540 can include notches 1542 for accepting fasteners (not shown) that can be used to secured tongue 1500 to an inside surface of enclosure 102 for computer 100 (both shown in FIG. 1) or other electronic device. Alternatively, backplate 1550 can be attached to reinforcement frame 1560, crossbar 1532, and crossbar 1592, before tongue molding 1510 is molded. Also, top ground pad 1530 can be attached to reinforcement frame 1560 using crossbar 1532 and bottom ground pad 1590 can be attached to reinforcement frame 1560 using crossbar 1592 after tongue 1510 has been molded, or these and other steps can be altered, omitted, or added during the assembly process in accordance with embodiments of the present invention.

In these and other embodiments of the present invention, liquid-detect contact 1586 on a top and bottom side of flexible circuit board 1580 can be either included or omitted. Where liquid-detect contacts 1586 are included, opening 1579 in bottom housing portion 1576 and corresponding openings (not shown) in top housing portion 1526 can also be included. Moisture on tongue molding 1510 can pass through openings 1579 in bottom housing portion 1576 and corresponding openings in top housing portion 1526 to reach liquid-detect contacts 1586. Voltage signals, such as a sine wave or pulse wave, can be applied to liquid-detect contacts 1586 and the presence of moisture can be detected using electrochemical-impedance spectroscopy (EIS). For example, a phase difference between a voltage signal applied to liquid-detect contacts 1586 and a resulting current can be determined, and from the determined phase shift the presence and characteristics of the moisture can be determined.

In FIG. 17, surface-mount contacting portions 1524 of contacts 1520 have been soldered to pads 1584 on a top side of flexible circuit board 1580. Similarly, surface-mount contacting portions 1574 of contacts 1570 (both shown in FIG. 16) have been soldered to pads 1584 on a bottom side of flexible circuit board 1580. Reinforcement frame 1560 has been attached to the resulting structure. Top ground pad 1530 can be attached to reinforcement frame 1560 using crossbar 1532. Bottom ground pad 1590 (shown in FIG. 16) can be attached to reinforcement frame 1560 using crossbar 1592 to form assembly structure 1790. Tongue molding 1510 can then be molded such that rear opening 1544 in bracket 1540 is formed around flexible circuit board 1580. Backplate 1550 can be slid over tongue molding 1510 and attached to reinforcement frame 1560, crossbar 1532, and crossbar 1592. Alternatively, backplate 1550 can be attached to reinforcement frame 1560, crossbar 1532, and crossbar 1592 before tongue molding 1510 is formed. Also, top ground pad 1530 and bottom ground pad 1590 can be attached to reinforcement frame 1560 after tongue molding 1510 is formed, or these and other steps can be altered, omitted, or added to the assembly process consistent with embodiments of the present invention. Reinforcement frame 1560 can include side ground contacts 1562, which may remain uncovered by tongue molding 1510 on tongue 1500.

In another example, top contacts can be held together by a top housing portion and bottom contacts can be held together by a bottom housing portion. Depending on a thickness of the contacts, the top housing portion and the bottom housing portion can perform some or all of the functions of spring fingers. An insulating layer can be positioned between the top housing portion and the bottom housing portion. The insulating layer can be adhesive or have one or more adhesive surfaces to help with assembly. A reinforcement frame can be positioned along sides of the top housing portion and the bottom housing portion for electromagnetic interference shielding, grounding, and mechanical support. A ground pad for a top of a tongue and a ground pad for a bottom of the tongue can be added. A tongue portion can be molded around this assembly such that a rear opening providing access to surface-mount contact portions of the top contacts and bottom contacts is provided. A flexible circuit board can be inserted into the opening in the back of the molded tongue portion. Surface-mount contacting portions of the top contacts and bottom contacts can be reflow soldered to pads on the flexible circuit board. An example is shown in the following figures.

Figure 18:
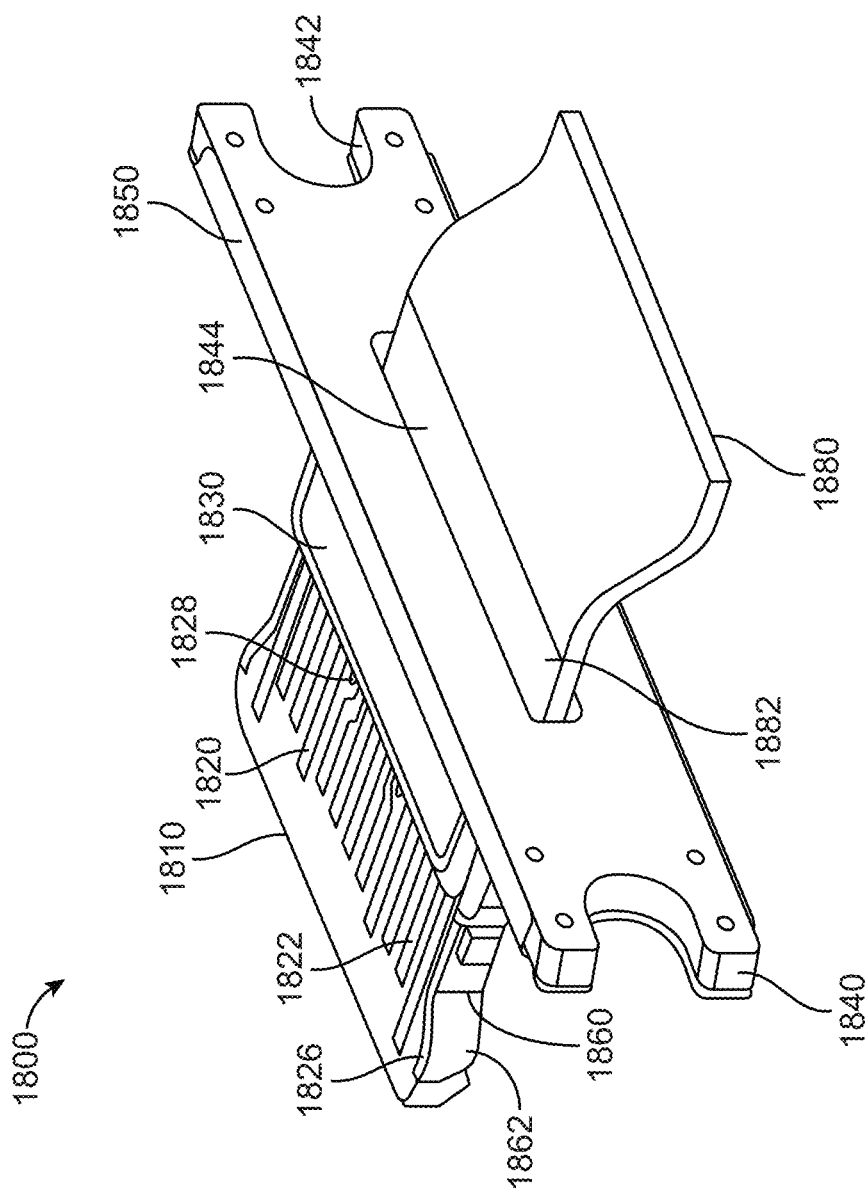
FIG. 18 illustrates a tongue for a connector insert or connector receptacle according to an embodiment of the present invention.

FIG. 18 illustrates another tongue for a connector insert or connector receptacle according to an embodiment of the present invention. Tongue 1800 can include tongue molding 1810 supporting support structure or top housing portion 1826 on a top side of tongue molding 1810 and support structure or bottom housing portion 1876 (shown in FIG. 19) on a bottom side of tongue molding 1810. Top housing portion 1826 can support contacts 1820, while bottom housing portion 1876 can support contacts 1870 (shown in FIG. 19.) Tongue molding 1810 can further support top ground pad 1830 on a top side, and bottom ground pad 1890 (shown in FIG. 19) on a bottom side. Reinforcement frame 1860 can include side ground contacts 1862. Tongue 1800 can further include bracket 1840, which can support backplate 1850. Bracket 1840 can include notches 1842 for fasteners or other structures to attach tongue 1800 in place in computer 100 (shown in FIG. 1) or other electronic device. Tongue 1800 can include rear opening 1844, through which thickened portion 1882 of flexible circuit board 1880 can pass or be inserted into. Thickened portion 1882 of flexible circuit board 1880 can be thickened with reinforcing and other layers. In these and other embodiments of the present invention, thickened portion 1882 can be omitted and the reinforcing layers not included. Flexible circuit board 1880 can be the same or similar to, or include the various features of, flexible circuit board 920 (shown in FIG.

13) and the other flexible circuit boards shown herein or provided by embodiments of the present invention.

Top housing portion 1826 can further support one, two, or more than two liquid-detect contacts 1828, while bottom housing portion 1876 can support one, two, or more than two liquid-detect contacts (not shown) that can be the same or similar to liquid-detect contacts 1828. One of the liquid-detect contacts 1828 can be positioned between VBUS contact 1829 and CC contact 1827, which can be the worst corrosion path on a Universal-Serial Bus Type-C connector. The CC contact 1827 can be routed around liquid-detect contact 1828, while VBUS contact 1829 can be unchanged to avoid an increase in series resistance.

Liquid-detect contacts 1828 can be short in length, extending only a short distance beyond top ground pad 1830 on a top side of tongue 1800, and bottom ground pad 1890 on a bottom side of tongue 1800. In this way, liquid-detect contacts 1828 do not connect to any of the contacts (not shown) of a connector insert (not shown) when the connector insert is inserted into a connector receptacle housing tongue 1800. Connector receptacle interface circuitry (not shown) can provide a voltage waveform to liquid-detect contacts 1828 to determine the presence of moisture using Electrochemical-Impedance Spectroscopy (EIS.) The voltage waveform can be a sinewave, square wave, or other voltage waveform. When moisture is present at a liquid-detect contact 1828, a current can result. The connector receptacle interface circuitry can detect the magnitude of this current and any phase shift as compared to the applied voltage. From this, the presence of moisture and information regarding the type of moisture that is present can be determined. Further details of this can be found in co-pending U.S. patent application Ser. No. 17/229,660, filed Apr. 13, 2021, titled LIQUID DETECTION AND CORROSION MITIGATION, which is incorporated by reference.

Contacting surfaces 1822 of contacts 1820 and contacting surfaces 1872 of contacts 1870 can physically and electrically connect to contacts of a corresponding connector (not shown) when the corresponding connector is mated with a connector utilizing tongue 1800. Side ground contacts 1862 can physically and electrically contact an inside surface of a shield (not shown) of the corresponding connector when the corresponding connector is mated with a connector utilizing tongue 1800. Top ground pad 1830 and bottom ground pad 1890 can physically and electrically connect to ground contacts near an opening of the corresponding connector when the corresponding connector is mated with a connector utilizing tongue 1800. Tongue 1800 can be formed in various ways. An example is shown in the following figures.

Figure 19:
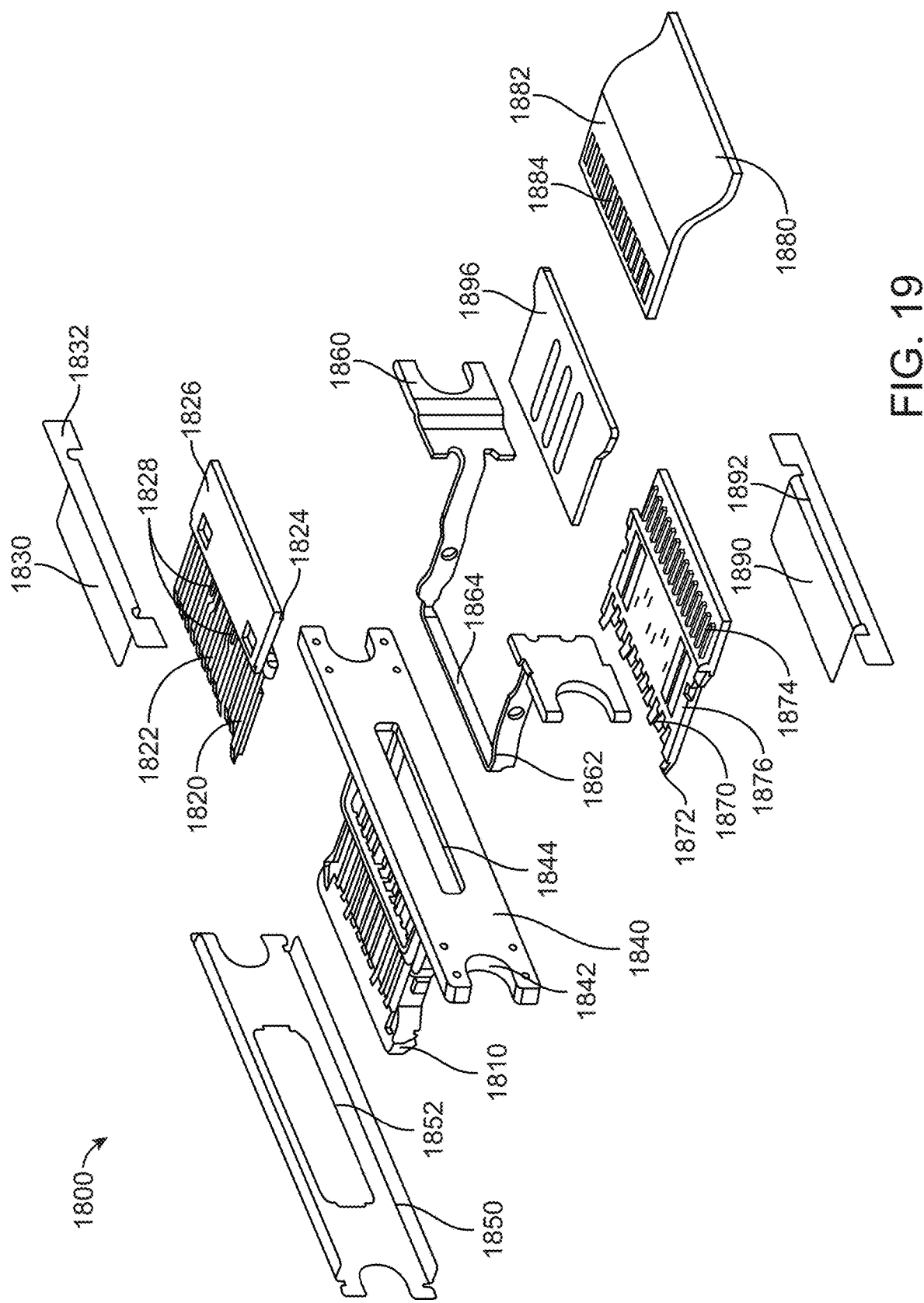
FIG. 19 through FIG. 21 illustrate a method of manufacturing the tongue of FIG. 18 for a connector receptacle or a connector insert according to an embodiment of the present invention.
Figure 20:
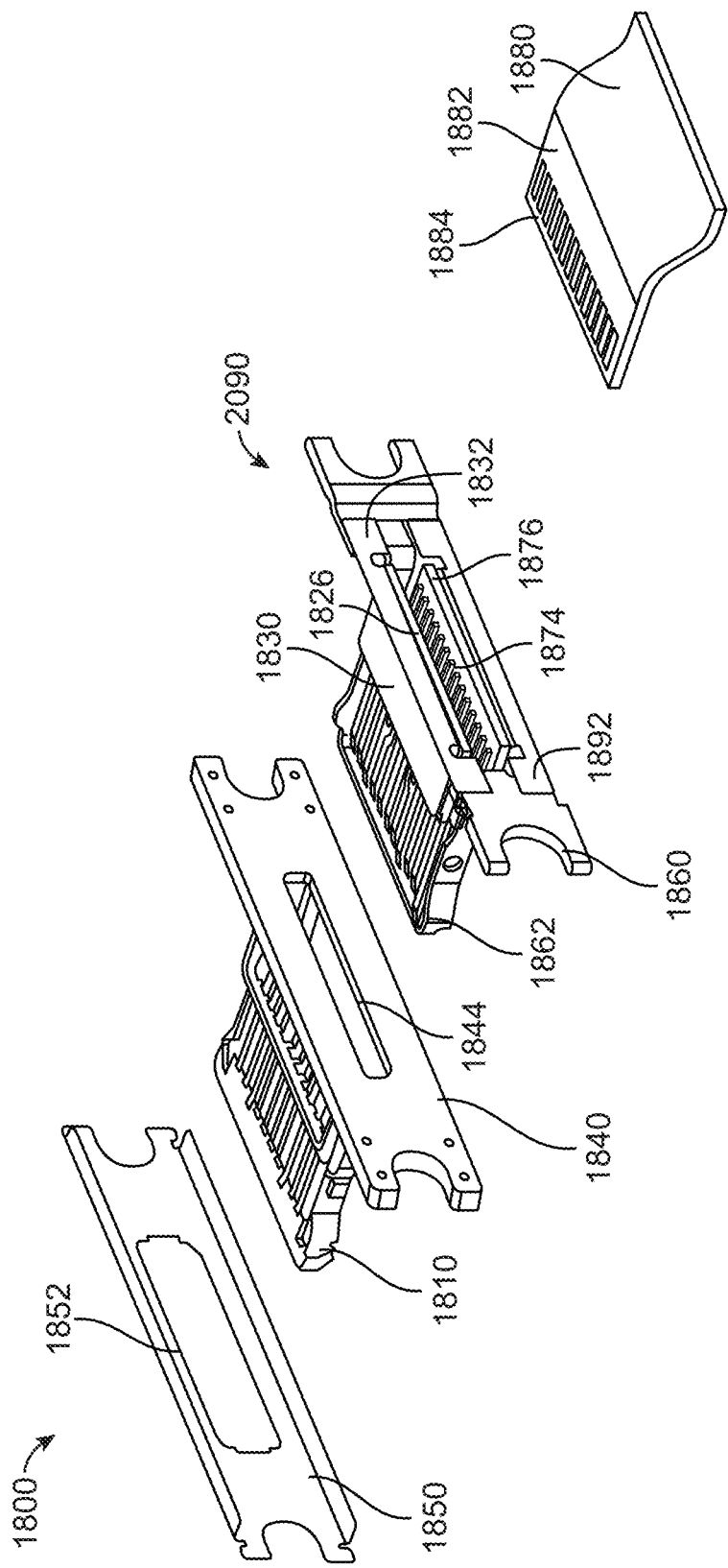
Figure 21:
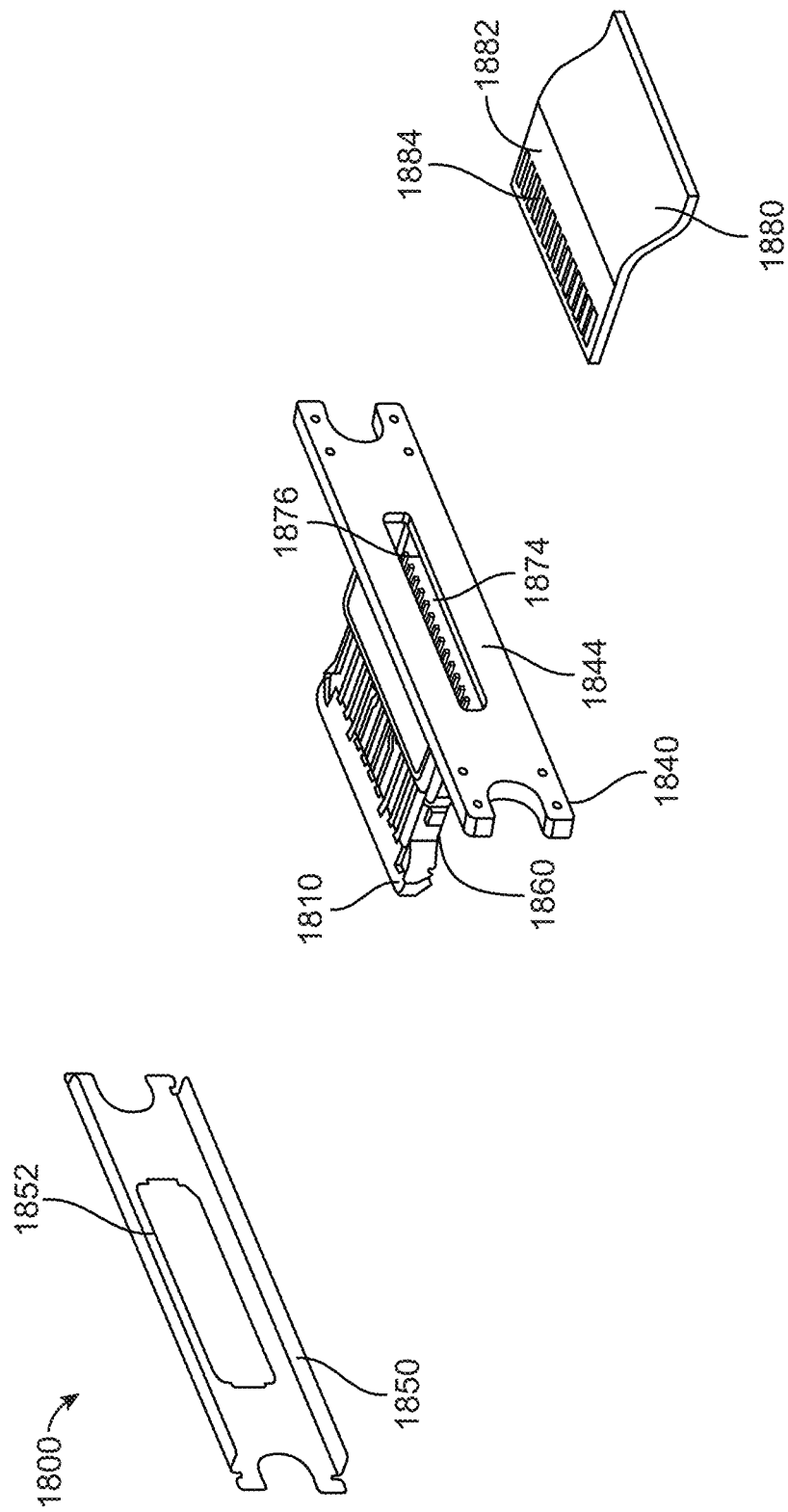

FIG. 19 through FIG. 21 illustrate a method of manufacturing a tongue for a connector receptacle or a connector insert according to an embodiment of the present invention. In FIG. 19, tongue 1800 can include contacts 1820 and contacts 1870, as well as liquid-detect contacts 1828 on a top side and liquid-detect contacts (not shown) on a bottom side. Contacts 1820 can include contacting surfaces 1822 and surface-mount contacting portions 1824. Contacts 1820 can be held in place by top housing portion 1826. Top housing portion 1826 can be molded around portions of contacts 1820 and liquid-detect contacts 1828. Contacts 1870 can include contacting surfaces 1872 and surface-mount contacting portions 1874. Contacts 1870 can be held in place by bottom housing portion 1876. Bottom housing portion 1876 can be molded around portions of contacts 1870 and liquid-detect contacts (not shown.)

Flexible circuit board 1880 can include thickened portion 1882 that can support pads 1884 on a top and bottom side. Surface-mount contacting portions 1824 of contacts 1820 can be soldered to pads 1884 on a top side of flexible circuit board 1880, while surface-mount contacting portions 1874 of contacts 1870 can be soldered to corresponding pads 1884 on a bottom side of flexible circuit board 1880. Portion 1864 of reinforcement frame 1860 can be placed along a front and sides of the resulting structure that includes flexible circuit board 1880, top housing portion 1826, and bottom housing portion 1876. Top ground pad 1830 can be attached to reinforcement frame 1860 using crossbar 1832, while bottom ground pad 1890 can be attached to reinforcement frame 1860 using crossbar 1892 to complete assembly structure 2090 (shown in FIG. 20.)

Tongue molding 1810 can be molded or otherwise formed around assembly structure 2090. Tongue molding 1810 can include rear opening 1844 in bracket 1840. Tongue molding 1810 can be inserted through opening 1852 of backplate 1850. Backplate 1850 can be attached to reinforcement frame 1860, crossbar 1832, and crossbar 1892. Bracket 1840 can include notches 1842 for accepting fasteners (not shown) that can be used to secured tongue 1800 to an inside surface of enclosure 102 for computer 100 (both shown in FIG. 1) or other electronic device. Alternatively, backplate 1850 can be attached to reinforcement frame 1860, crossbar 1832, and crossbar 1892 before tongue molding 1810 is molded. Also, top ground pad 1830 can be attached to reinforcement frame 1860 using crossbar 1832 and bottom ground pad 1890 can be attached to reinforcement frame 1860 using crossbar 1892 after tongue 1810 has been molded, or these and other steps can be altered, omitted, or added to the assembly process consistent with embodiments of the present invention. Spacer or insulating layer 1896 can be positioned between top housing portion 1826 and bottom housing portion 1876 to provide clearance between and isolate contacts 1820 from contacts 1870. Insulating layer 1896 can act as a spacer and can take the place of a portion of flexible circuit board 1880 since flexible circuit board 1880 does not extend as far into tongue 1800 as compared to how far flexible circuit board 1580 extends into tongue 1500 (both shown in FIG. 16.) Insulating layer 1896 can be adhesive or have either or both adhesive top and bottom sides to aid in assembly.

In FIG. 20, insulating layer 1896 (shown in FIG. 19) has been placed between top housing portion 1826 and bottom housing portion 1876. Reinforcement frame 1860 has been attached to the resulting structure. Ground pad 1830 has been attached to reinforcement frame 1860 using crossbar 1832, and ground pad 1890 has attached to reinforcement frame 1860 using crossbar 1892 to form assembly structure 2090.

Tongue molding 1810 of tongue 1800 can then be molded such that side ground contacts 1862 are exposed and rear opening 1844 is formed exposing surface-mount contacting portions 1824 (shown in FIG. 19) on top housing portion 1826 and surface-mount contacting portions 1874 on bottom housing portion 1876. Backplate 1850 can be slid over tongue molding 1810 and attached to reinforcement frame 1860, crossbar 1832, and crossbar 1892. Alternatively, backplate 1850 can be attached to reinforcement frame 1860, crossbar 1832, and crossbar 1892 before tongue molding 1810 is formed. Also, top ground pad 1830 and bottom ground pad 1890 can be attached to reinforcement frame 1860 after tongue molding 1810 is formed, or these and other steps can be altered, omitted, or added to the assembly process consistent with embodiments of the present invention. Reinforcement frame 1860 can include side ground contacts 1862, which may remain uncovered by tongue molding 1810. Flexible circuit board 1880 can include thickened portion 1882 supporting pads 1884 on a top and bottom side.

In FIG. 21, assembly structure 2090 (shown in FIG. 20) has been molded by tongue molding 1810. Tongue molding 1810 can be fit into opening 1852 of backplate 1850. Backplate 1850 can be attached to reinforcement frame 1860, crossbar 1832, and crossbar 1892. Flexible circuit board 1880 can be fit into rear opening 1844 in a back of bracket 1840. Contacts or pads 1884 on a top of thickened portion 1882 of flexible circuit board 1880 can be reflow soldered to surface-mount contacting portions 1824 on top housing portion 1826 (both shown in FIG. 19) and contacts or pads 1884 on a bottom of thickened portion 1882 of flexible circuit board 1880 can be reflow soldered to surface-mount contacting portions 1874 on bottom housing portion 1876.

While embodiments of the present invention can be useful as USB Type-C connector inserts and connector receptacles, these and other embodiments of the present invention can be used as connector receptacles in other types of connector systems, such as a Peripheral Component Interconnect express (PCIe) connector system.

In various embodiments of the present invention, spring fingers, contacts, shields, ground plates, ground pads, cross bars, reinforcement frames, and other conductive portions of a connector insert or connector receptacle can be formed by stamping, metal-injection molding, machining, micro-machining, 3-D printing, or other manufacturing process. The conductive portions can be formed of stainless steel, steel, copper, copper titanium, phosphor bronze, or other material or combination of materials. They can be plated or coated with nickel, gold, or other material.

The nonconductive portions, such as the housings, housing portions, tongue moldings, insulating layers, spring fingers, and other structures can be formed using injection or other molding, 3-D printing, machining, or other manufacturing process. The nonconductive portions can be formed of silicon or silicone, rubber, hard rubber, plastic, nylon, liquid-crystal polymers (LCPs), ceramics, or other nonconductive material or combination of materials. The printed circuit boards used can be formed of FR-4 or other material. The contacts can be plated, formed by vapor deposition, soldered, or formed in other ways on the flexible circuit boards.

Embodiments of the present invention can provide connector receptacles and connector inserts that can be located in, and can connect to, various types of devices, such as portable computing devices, tablet computers, desktop computers, laptops, all-in-one computers, wearable computing devices, cell phones, smart phones, media phones, storage devices, portable media players, navigation systems, monitors, power supplies, video delivery systems, adapters, remote control devices, chargers, and other devices. These connector receptacles and connector inserts can provide interconnect pathways for signals that are compliant with various standards such as one of the Universal Serial Bus (USB) standards including USB Type-C, High-Definition Multimedia Interface® (HDMI), Peripheral Component Interconnect express, Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. Other embodiments of the present invention can provide connector receptacles and connector inserts that can be used to provide a reduced set of functions for one or more of these standards. In various embodiments of the present invention, these interconnect paths provided by these connector receptacles can be used to convey power, ground, signals, test points, and other voltage, current, data, or other information.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A connector comprising:
   a flexible circuit board;
   a first plurality of contacts, each having a surface-mount contacting portion soldered to a pad on a top side of the flexible circuit board, the first plurality of contacts including a first liquid-detect contact;
   a top housing portion supporting the first plurality of contacts;
   a second plurality of contacts, each having a surface-mount contacting portion soldered to a pad on a bottom side of the flexible circuit board, the second plurality of contacts including a second liquid-detect contact; and
   a bottom housing portion supporting the second plurality of contacts.

2. The connector of claim 1 further comprising a tongue molding formed at least partially around the top housing portion and the bottom housing portion.

3. The connector of claim 2 further comprising a reinforcement frame around a front and sides of the top housing portion and the bottom housing portion.

4. The connector of claim 3 wherein the tongue molding comprises a bracket and the bracket comprises features for accepting fasteners to secure the tongue molding to an enclosure of an electronic device.

5. The connector of claim 4 further comprising a top ground pad connected to the reinforcement frame and a bottom ground pad connected to the reinforcement frame.

6. The connector of claim 5 further comprising a backplate connected to the top ground pad and the bottom ground pad.

7. The connector of claim 6 wherein the top housing portion includes a first opening to provide access to the first liquid-detect contact on the top side of the flexible circuit board and the bottom housing portion includes a second opening to provide access to the second liquid-detect contact on the bottom side of the flexible circuit board.

8. A connector comprising:
a first plurality of contacts, each having a contacting surface and a surface-mount contacting portion;
a top housing portion supporting the first plurality of contacts;
a second plurality of contacts, each having a contacting surface and a surface-mount contacting portion;
a bottom housing portion supporting the second plurality of contacts; and
a tongue molding at least partially around the top housing portion and the bottom housing portion and having a rear opening such that the contacting surfaces of the first plurality of contacts are exposed on a top of the tongue molding, the contacting surfaces of the second plurality of contacts are exposed on a bottom of the tongue molding, the surface-mount contacting portions of the first plurality of contacts are exposed at a top of the rear opening, and the surface-mount contacting portions of the second plurality of contacts are exposed at a bottom of the rear opening; and
a flexible circuit board having a first end positioned in the rear opening and having a third plurality of contacts on a top of the flexible circuit board and connected to the surface-mount contacting portions of the first plurality of contacts, and a fourth plurality of contacts on a bottom of the flexible circuit board and connected to the surface-mount contacting portions of the second plurality of contacts.

9. The connector of claim 8 further comprising an insulating layer between the top housing portion and the bottom housing portion.

10. The connector of claim 9 wherein the insulating layer is adhesive.

11. The connector of claim 9 wherein the insulating layer has one or more of an adhesive top side and an adhesive bottom side.

12. The connector of claim 9 wherein the tongue molding comprises a bracket having the rear opening.

13. The connector of claim 12 wherein the rear opening in the bracket provides access to the surface-mount contacting portions of the first plurality of contacts the surface-mount contacting portions of the second plurality of contacts.

14. The connector of claim 13 further comprising a reinforcement frame around a front and sides of the top housing portion and the bottom housing portion.

15. The connector of claim 14 wherein the bracket comprises features for accepting fasteners to secure the tongue molding to an enclosure of an electronic device.

16. The connector of claim 15 further comprising a top ground pad connected to the reinforcement frame and a bottom ground pad connected to the reinforcement frame.

17. The connector of claim 16 further comprising a backplate connected to the top ground pad and the bottom ground pad.

18. A connector comprising:
a tongue;
a first support structure at a top of the tongue;
a second support structure at a bottom of the tongue;
a flexible circuit board, wherein the flexible circuit board comprises:
    a first layer supporting a plurality of first traces and a first ground plane;
    a second layer supporting a plurality of second traces under the first ground plane, the second traces in the plurality of second traces coupled to corresponding first traces in the plurality of first traces by a plurality of vias; and
    a third layer supporting a second ground plane under the plurality of second traces;
a first plurality of contacts supported by the first support structure and soldered to a top side of the flexible circuit board, each of the first plurality of contacts attached to a corresponding first trace in the plurality of first traces on the first layer of the flexible circuit board; and
a second plurality of contacts supported by the second support structure.

19. The connector of claim 18 wherein the first plurality of contacts comprises a first liquid detect contact and the second plurality of contacts comprises a second liquid detect contact.

* * * * *